（12） United States Patent
Li et al.

(10) Patent No.: US 10,950,321 B2
(45) Date of Patent: Mar. 16, 2021

(54) SHIFT REGISTER, GATE DRIVING CIRCUIT, DISPLAY PANEL AND DISPLAY DEVICE

(71) Applicant: SHANGHAI TIANMA AM-OLED CO., LTD., Shanghai (CN)

(72) Inventors: Yue Li, Shanghai (CN); Xingyao Zhou, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/852,223

(22) Filed: Apr. 17, 2020

(65) Prior Publication Data

US 2020/0243151 A1    Jul. 30, 2020

(30) Foreign Application Priority Data

Dec. 25, 2019    (CN) .......................... 201911359311.6

(51) Int. Cl.
  *G11C 19/28*    (2006.01)
  *G09G 3/20*    (2006.01)
(52) U.S. Cl.
  CPC ........... *G11C 19/28* (2013.01); *G09G 3/2092* (2013.01); *G09G 2310/0275* (2013.01); *G09G 2310/0286* (2013.01)
(58) Field of Classification Search
  CPC ................. G11C 19/28; G09G 3/2092; G09G 2310/0275; G09G 2310/0286
  See application file for complete search history.

(56) References Cited

U.S. PATENT DOCUMENTS

| | | | | |
|---|---|---|---|---|
| 2017/0124936 | A1* | 5/2017 | Tseng | G09G 3/3266 |
| 2017/0256204 | A1* | 9/2017 | Xiang | G09G 3/3266 |
| 2017/0309211 | A1* | 10/2017 | Zhang | G09G 3/3674 |
| 2018/0130541 | A1* | 5/2018 | Li | G11C 19/184 |
| 2018/0374410 | A1* | 12/2018 | Zhu | G09G 3/20 |

FOREIGN PATENT DOCUMENTS

CN    109308864 A    2/2019

* cited by examiner

*Primary Examiner* — Peter D McLoone
(74) *Attorney, Agent, or Firm* — Alston & Bird LLP

(57) ABSTRACT

Disclosed are a shift register, gate electrode driving circuit, display panel and display device. The shift register includes a second output module and a coupling module, the coupling module having two ends electrically connected to a third node and a second signal output end respectively. In a second phase, a potential at a fourth node is an enable level, the second output module transfers a high-level signal at a first power source signal input end to a second output end; in a third phase, a potential at the third node is the enable level, the second output module transfers a low-level signal at a second power source signal input end to the second output end; the low-level signal at the second output end is coupled to the third node through a coupling function of the coupling module, the potential at the third node is then lower in the third phase than in the second phase.

20 Claims, 21 Drawing Sheets

SHIFT REGISTER, GATE DRIVING CIRCUIT, DISPLAY PANEL AND DISPLAY DEVICE

CROSS-REFERENCE TO RELATED APPLICATION

This application claims priority to a Chinese patent application No. CN201911359311.6, filed with CNIPA on Dec. 25, 2019, the content of which is incorporated herein by reference in its entirety.

TECHNICAL FIELD

The present disclosure relates to the field of display technology and, in particular, to a shift register, gate driving circuit, display panel and display device.

BACKGROUND

With the development of display technologies, higher definition is pursued for display devices, however power consumption of the display devices is increasing. In order to reduce power consumption of a display device, in a certain duration, a frame rate may be reduced and pixels may be driven at a low speed. For example, a mobile terminal works at a normal driving frequency of 60 Hz or 120 Hz in a normal display mode but works at a driving frequency of 1 Hz to 5 Hz in a standby mode.

In general, in order to ensure stable display, the pixel driving circuit of a display device may be designed to use P-channel Metal Oxide Semiconductor Field Effect-Transistors (PMOSFETs). However, since the PMOS formed of Low Temperature Poly-Silicon (LTPS) has a large leakage current, data updating period will lasts longer while driven at a low frame rate. When a leakage current exists in a pixel, a flicker will occur at that pixel for a displayed image, so the image cannot be displayed normally. Therefore, some PMOSFETs in the pixel driving circuit may be substituted by N-channel Metal Oxide Semiconductor Field Effect-Transistors (NMOSFETs); however, a traditional shift register uses PMOS shift, in which high-level (herein "level" may also be called "potential") shifting includes "step-down", i.e., a high level is converted into a low level via an intermediate level, and the high level can hardly be shifted effectively, i.e., the cascade shifting of high-level and low-level signals cannot be implemented without loss. Meanwhile, a transistor cannot be turned off completely (i.e., "cut-off") under the control of a control end, and the leakage current still exists, affecting display effect.

SUMMARY

The present disclosure provides a shift register, gate driving circuit, display panel and display device, so as to implement cascade shifting of high-level and low-level signals without loss and thus shifting of positive and negative levels; this is beneficial to complete turn-off of the transistor under the control of the control end, so as to avoid leakage current and improve display effect.

In a first aspect, the present disclosure provides a shift register, the shift register includes a shift register signal input end, a first clock signal end, a second clock signal end, a third clock signal end, a first power source signal input end, a second power source signal input end, a first signal input end, a second signal input end, a first node, a second node, a third node, a fourth node, a first node control module, a second node control module, a third node control module, a fourth node control node, a first output module, a second output module, a storage module and a coupling module;

the first node control module comprises a first alpha control end, a second alpha control end, a third alpha control end, a first alpha input end, a second alpha input end and an alpha output end, the first alpha control end is electrically connected to the first clock signal end, the second alpha control end is electrically connected to the second clock signal end, the third alpha control end is electrically connected to the first node, the first alpha input end is electrically connected to the shift register signal input end, the second alpha input end is electrically connected to the first power source signal input end, the alpha output end is electrically connected to the second node; the first node control module is configured to control a connection between the first alpha input end and the alpha output end according to a signal inputted from the first alpha control end, or control a connection between the second alpha input end and the alpha output end according to a signal inputted from the second alpha control end and a signal inputted from the third alpha control end;

the second node control module comprises a first beta control end, a second beta control end, a first beta input end, a second beta input end and a beta output end, the first beta control end is electrically connected to the first clock signal end, the second beta control end is electrically connected to the second node, the first beta input end is electrically connected to the second power source signal input end, the second beta input end is electrically connected to the shift register signal input end, the beta output end is electrically connected to the first node; the second node control module is configured to control a connection between the first beta input end and the beta output end according to a signal inputted from the first beta control end, or control a connection between the second beta input end and the beta output end according to a signal inputted by the second beta control end;

the first output module comprises a first gamma control end, a second gamma control end, a first gamma input end, a second gamma input end, a gamma coupling end and a gamma output end, the first gamma control end is electrically connected to the first node, the second gamma control end and the gamma coupling end are electrically connected to the second node, the first gamma input end is electrically connected to the first power source signal input end, the second gamma input end is electrically connected to the second clock signal end, the gamma output end is electrically connected to the first signal output end; the first output module is configured to control a connection between the first gamma input end and the gamma output end according to a signal inputted from the first gamma control end, or control a connection between the second gamma input end and the gamma output end according to a signal inputted from the second gamma control end;

the third node control module comprises a first delta control terminal, a second delta control end, a first delta input end, a second delta input end and a delta output end, the first delta control end is electrically connected to the first signal output end, the second delta control end is electrically connected to the third clock signal input end, the first delta input end is electrically connected to the first power source signal input end, the second delta input end is electrically connected to the second power source signal input end, the delta output end is electrically connected to the third node; the third node control module is configured to control a connection between the first delta input end and the delta output end according to a signal inputted from the first delta control end, or control a connection between the second delta input end and the delta output end according to a signal inputted from the second delta control end;

the fourth node control module comprises a first epsilon control end, a second epsilon control end, a first epsilon input end, a second epsilon input end and an epsilon output end, the first epsilon control end is electrically connected to the third node, the second epsilon control end is electrically connected to the first signal output end, the first epsilon input end is electrically connected to the first power source signal input end, the second epsilon input end is electrically connected to the second power source signal input end, the epsilon output end is electrically connected to the fourth node; the fourth node control module is configured to control connection between the first epsilon input end and the epsilon output end according to a signal inputted from first epsilon control end, or control a connection between the second epsilon input end and the epsilon output end according to a signal inputted from the second epsilon control end;

the second output module comprises a first zeta control end, a second zeta control end, a first zeta input end, a second zeta input end and a zeta output end, the first zeta control end is electrically connected to the fourth node, the second zeta control end is electrically connected to the third node, the first zeta input end is electrically connected to the first power source signal input end, the second zeta input end is electrically connected to the second power source signal input end, the zeta output end is electrically connected to the second signal output end; the second output module is configured to control a connection between the first zeta input end and the zeta output end according to a signal inputted from the first zeta control end, or control a connection between the second zeta input end and the zeta output end according to a signal inputted from the second zeta control end;

the storage module comprises a first eta end and a second eta end, the first eta end is electrically connected to the first node, the second eta end is electrically connected to the first power source signal input end; the storage module is configured to maintain a stable potential at the first node;

the coupling module comprises a first theta end a second theta end, the first theta end is electrically connected to the third node, the second theta end is electrically connected to the second signal input end; the coupling module is configured to, in a case where a potential at the second signal input end varies, couple the potential at the second signal input end to the third node.

In a second aspect, the present disclosure further provides a gate driving circuit, the gate driving circuit includes shift registers provided in the first aspect connected in cascade.

the shift register signal input end of a shift register in a first stage among the plurality of shift registers is electrically connected to an initial signal input end of the gate driving circuit, the first signal output end of a shift register in an i-th stage is electrically connected to the shift register signal input end of a shift register in an (i+1)-th stage; wherein i is an positive integer.

In a third aspect, the present disclosure provides a display panel, the display panel includes a display region and a non-display region surrounding the display region, the non-display region is provided with a gate driving circuit provided in the second aspect.

In a fourth aspect, the present disclosure further provides a display device, the display device includes a display panel provided in the third aspect.

According to the shift register, gate driving circuit, display panel and display device of the present disclosure, the shift register includes the first node control module, the second node control module, the third node control module, the fourth node control module, the first output module, the second output module, the storage module and the coupling module; the storage module has two ends electrically connected to the first node and the first power source signal input end respectively, the coupling module has two ends electrically connected to the third node and the second signal output end respectively. In a first phase, the potential at the second node is an enable level, the first output module may transfer a high-level signal at the second clock signal end to the first output end; at the same time, the potential at the first node is the enable level, the first output module may transfer a high-level signal at the first power source signal input end to the first output end, i.e., the high-level signal is outputted at the first output end; at this time, the potential at the third node is the enable level, the second output module transfers a low-level signal at the second power source signal input end to the second output end, i.e., the low-level signal is outputted at the second output end. In a second phase, since the gamma coupling end of the first output module has the function of potential holding, the enable level at the second node is held, the first output module may transfer the low-level signal at the second clock signal end to the first output end; at the same time, since the second node is suspended, the coupling function of the gamma coupling end of the first output module enables the potential signal at the second clock signal end to be coupled to the second node, so that the second node is coupled to a lower level, thus the low-level signal is outputted via the first output end without loss; at the same time, the potential at the fourth node is the enable level, the second output module transfers the high-level signal at the first power source signal input end to the second output end. In a third phase, the potential at the third node is the enable level, the second output module transfers a low-level signal at the second power source signal input end to the second output end, that is, a signal at the second output end transitions from a high level to a low level; at this time, the low-level signal at the second output end is coupled to the third node through the coupling function of the coupling module, the potential at the third node is then lower in the third phase than in the second phase, so that the low-level signal at the second power source signal input end is transferred without loss, which is beneficial to the complete cut-off of a transistor under the control of the second signal output end and avoids leakage current loss. In other words, the shift register can implement cascade shifting of high-level and low-level signals without loss, i.e., can implement shifting of positive and negative levels; further, the shift register can completely turn off transistors in pixel driving circuits for PMOS and NMOS transistors, which avoids leakage current loss and is beneficial to improvement of image display effect of the display panel and the display device.

DETAILED DESCRIPTION

The present disclosure is further described in detail below in conjunction with drawings and embodiments. It can be understood that, the specific embodiment described herein are merely used to illustrate, but not to limit, the present disclosure. It should be further noted that, for ease of description, the drawings merely illustrate part, but not all, of the structure related to the present disclosure.

Figure 1:
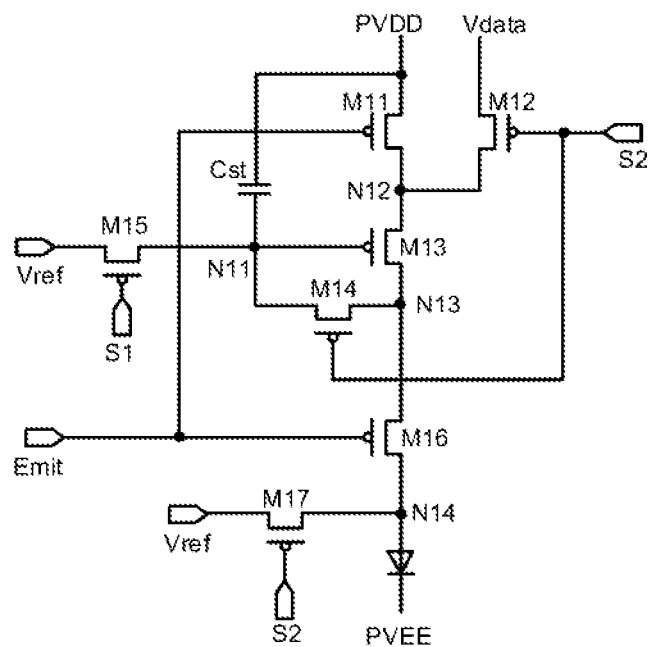
FIG. 1 is a circuit diagram of a pixel driving circuit in the related art.
Figure 2:
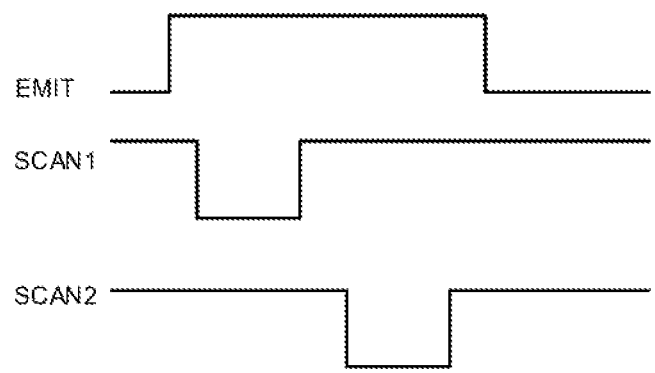
FIG. 2 is the driving timing sequence of the pixel driving circuit of FIG. 1.

FIG. 1 is a circuit diagram of a pixel driving circuit in the related art, and shows a pixel driving circuit with a PMOS design; FIG. 2 is a schematic diagram illustrating a driving timing sequence of the pixel driving circuit of FIG. 1, in which the low-level signal is an enable signal. Referring to FIG. 1 and FIG. 2, a first scanning signal SCAN1 represents a control signal received at a first scanning signal end S1, a second scanning signal SCAN2 represents a control signal received at a second scanning signal end S2, a light-emitting control signal EMIT represents a signal received at a light-emitting control end Emit; Vref represents an initialization signal end and is used to reset a first potential point N11 and a fourth potential point N14; PVDD and PVEE represent an anode potential signal end and a cathode potential signal end of a light-emitting element respectively, Vdata represents a data signal end and its potential is used to determine light-emitting brightness (i.e., gray level) of the light-emitting element. Exemplarily, according to different enable phases of the first scanning signal SCAN1, the second scanning signal SCAN2 and the light-emitting control signal EMIT, a driving timing sequence of the pixel driving circuit may be divided into three durations, i.e., an initialization duration, a threshold acquisition duration and a light-emitting duration.

In the initialization duration, the first scanning signal SCAN1 is a low-level signal, the second scanning signal SCAN2 and the light-emitting control signal EMIT are high-level signals; at this time, a first initialization transistor M15 turns on, a low-level signal at the initialization signal end Vref is written into the first potential point N11, so as to initialize the first potential point N11 and ensure that a driving transistor M13 can turn on in the next duration.

In the threshold acquisition duration, the second scanning signal SCAN2 is a low-level signal, the first scanning signal SCAN1 and the light-emitting control signal EMIT are high-level signals; at this time, a second initialization transistor M17 turns on, the low-level signal at the initialization signal end Vref is written into a fourth potential point N14, so as to initialize the potential at the anode of the light-emitting element and avoid impact of the previous frame on the current frame; at the same time, a first data writing transistor M12 and a second data writing transistor M14 turn on, since the first potential point N11 is at the low level, the driving transistor M13 turns on, thus a data signal provided at the data signal end Vdata passes through the first data writing transistor M12, the second potential point N12, the driving transistor M13, the third potential point N13 and the second data writing transistor M14 in turn and is written into the first potential point N11; the potential at the first potential point N11 gradually increases till a gate-source voltage of the driving transistor M13 is equal to a threshold, that is, the driving transistor M13 turns off when a voltage difference between the first potential point N11 and the second potential point N12 is equal to a threshold for the voltage difference; at this time, the potential at the first potential point N11 is a potential difference between the potential at the data signal end Vdata and the threshold voltage of the driving transistor M13.

In the light-emitting duration, the light-emitting control signal EMIT is a low-level signal, the first scanning signal SCAN1 and the second scanning signal SCAN2 are high-level signals; at this time, the first light-emitting control transistor M11 and the second light-emitting control transistor M16 turn on, the driving transistor M13 operates in a saturation state, a driving current determined by the driving transistor M13 is:

$$I_d = \frac{1}{2}\mu C_{ox}\frac{W}{L}(V_{PVDD} - V_{data})^2;$$

where µ is carrier mobility of the driving transistor M13, W and L are width and length of a channel of the driving transistor M13, $C_{ox}$ is capacitance of a gate oxide layer per unit area of the driving transistor M13, $P_{VDD}$ is a potential value at the anode potential signal end PVDD and a potential value at the second potential point N12.

In the above driving timing sequence, one condition for the calculation of the driving current of the driving transistor M13 using the above formula is that the potential at the first potential point N11 can keep stable after the threshold acquisition duration finishes. However, in the pixel driving circuit as shown in FIG. 1, since the first initialization transistor M15 and the second initialization transistor M14 have large leakage currents, the storage capacitor Cst has a large leakage current. In view of the above, in a case of driving at a low frame rate, due to the large data updating period, the potential value at the first potential point N11 has a severe loss, i.e., the first potential point N11 has a poor performance in potential holding, and it is impossible to implement normal display.

In an embodiment, the transistor in connection with the first potential point N11 may be substituted by an NMOS transistor (e.g., N-type LTPO) which turns on at a high level. However, traditional PMOS shifting always has step-down, which causes incomplete turn-off of the NMOS transistor, the data holding state at the first potential point N11 is poor. The step-down of the PMOS shifting is exemplarily described in combination with FIG. 3 and FIG. 4.

Figure 3:
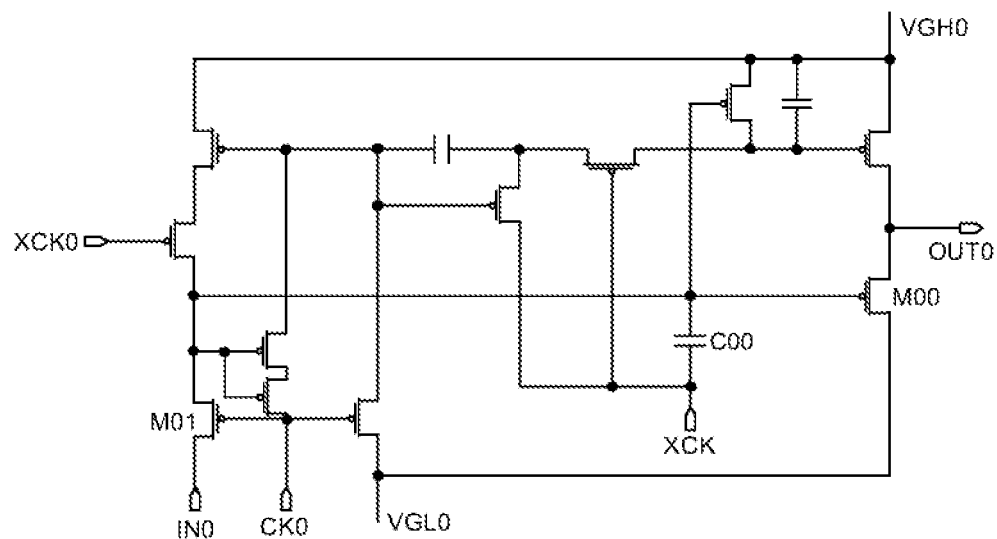
FIG. 3 is a circuit diagram of a shift register in the related art.
Figure 4:
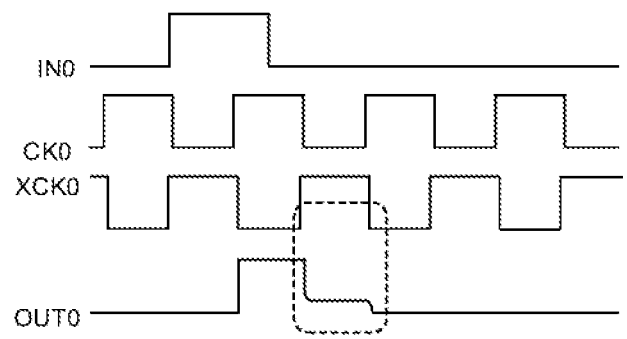
FIG. 4 is the driving timing sequence of the shift register of FIG. 3.

FIG. 3 is a circuit diagram of a shift register in the related art, FIG. 4 is a schematic diagram illustrating a driving timing sequence of the shift register of FIG. 3. Referring to FIG. 3 and FIG. 4, CK0 and XCK00 represent clock signals inputted at a positive clock signal end and a negative clock signal end respectively; IN0, VGL0, VGH0 and OUT0 represent signals at a signal input end, a low-level signal end, a high-level signal end and a signal output end respectively; M00 represents a signal output transistor connected to a low-level signal side. Description is made by means of an example of a low level of −7 V, a high level of +8 V and a threshold voltage of −2 V for the transistor M00. Referring to the potential at a position corresponding to the dashed line, in this duration, when CK0 is low and IN0 is low, the low-level signal at IN0 is transferred to the gate electrode of the transistor M00 via the transistor M01; at the same time, the low-level signal at VGL0 is transferred to the drain electrode of the transistor M00, the drain electrode of the transistor M00 is connected to the signal output end OUT0; at this time, the transistor M00 turns on, the potential signal at VGL0 is gradually transferred to the signal output end OUT0, and when the potential at OUT0 is equal to −5 V, the transistor M00 turns off. Therefore, the potential signal outputted at OUT0 is not the low-level signal at VGL0, but a sum of the low-level signal at VGL0 and the threshold voltage of the transistor M00. In the next duration, CK0 is high, IN0 is low and XCK00 is low, the transistor M01 turns off, the gate electrode of the transistor M00 is in a suspend state; the XCK00 signal varies from high to low and has a potential drop of 15 V, with the coupling function of a capacitor C00 connected to the transistor M00, the gate electrode of the transistor M00 has a potential drop of 15 V; based on the potential of −7 V in the previous duration, the potential at the gate electrode of the transistor M00 varies to −22 V, at this time, the low-level signal at VGL0 may be completely transferred to the drain electrode of the transistor M00, that is, a potential of −7 V is outputted at OUT0. In subsequent durations, since an output end of the shift register is connected to the pixel driving circuit, the coupling between a parasite capacitance in the pixel driving circuit and a line resistance enables the potential at the output end to be held at −7 V and is no longer affected by the variance of the potential of KCK00. An intermediate level, which occurs in the variance from the high-level signal to the low-level signal, may be "step-down".

In view of the above, the step-down exists in the high-level shifting of the PMOS transistor, which makes the NMOS transistor unable to completely turn off and still has the leakage current, thereby impacting the display effect. It can also be interpreted as incapability of implementing shifting of positive and negative levels for the shift register.

In an embodiment, an embodiment of the present disclosure provides a circuit of a shift register, which can implement shifting of positive and negative levels. The shift register provided in the present disclosure and the operating principle thereof are exemplarily described below in combination with FIG. 5 to FIG. 20.

Figure 5:
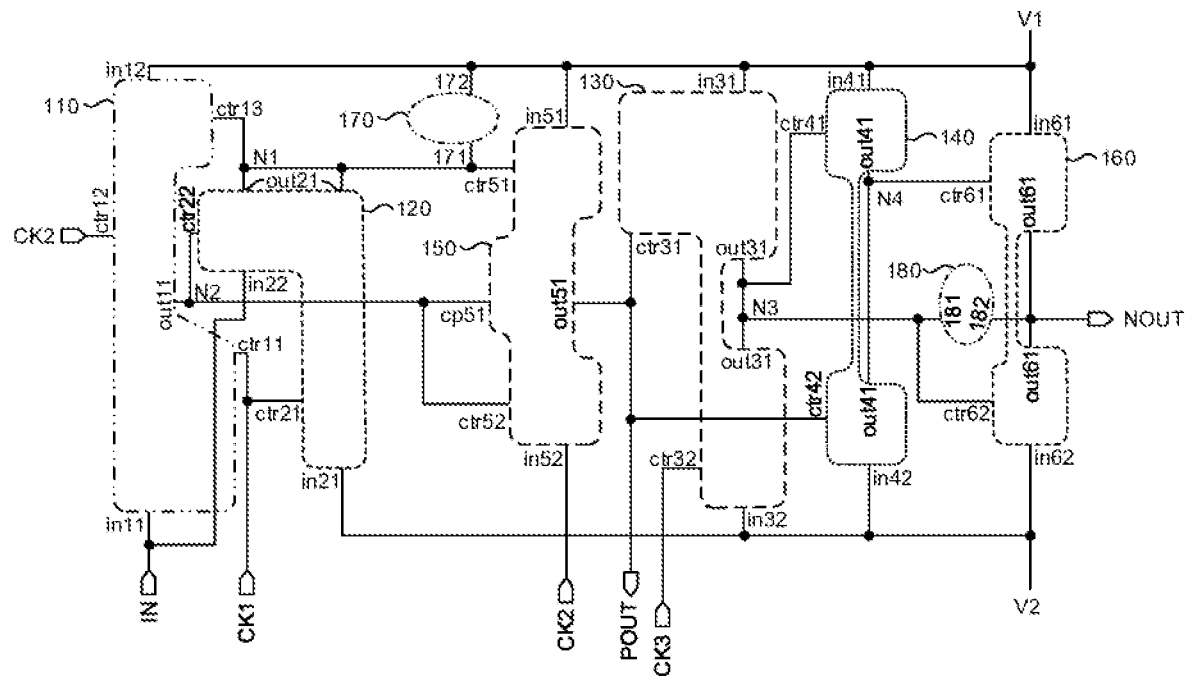
FIG. 5 is a circuit diagram of a shift register according to an embodiment of the present disclosure.

FIG. 5 is a structural diagram of a shift register according to an embodiment of the present disclosure. Referring to FIG. 5, the shift register includes a shift register signal input end IN, a first clock signal end CK1, a second clock signal end CK2, a third clock signal end CK3, a first power source signal input end V1, a second power source signal input end V2, a first signal input end POUT, a second signal input end NOUT, a first node N1, a second node N2, a third node N3, a fourth node N4, a first node control module 110, a second node control module 120, a third node control module 130, a fourth node control node 140, a first output module 150, a second output module 160, a storage module 170 and a coupling module 180; the first node control module 110 includes a first alpha control end ctr11, a second alpha control end ctr12, a third alpha control end ctr13, a first alpha input end in11, a second alpha input end in12 and an alpha output end out11, the first alpha control end ctr11 is electrically connected to the first clock signal end CK1, the second alpha control end ctr12 is electrically connected to the second clock signal end CK2, the third alpha control end ctr13 is electrically connected to the first node N1, the first alpha input end in11 is electrically connected to the shift register signal input end IN, the second alpha input end in12 is electrically connected to the first power source signal input end V1, the alpha output end out11 is electrically connected to the second node N2; the first node control module 110 is configured to control a connection between the first alpha input end in11 and the alpha output end out11 according to a signal inputted from the first alpha control end ctrl 1, or control a connection between the second alpha input end in12 and the alpha output end out11 according to a signal inputted from the second alpha control end ctr12 and a signal inputted from the third alpha control end ctr13; the second node control module 120 includes a first beta control end ctr21, a second beta control end ctr22, a first beta input end in21, a second beta input end in22 and a beta output end out21, the first beta control end ctr21 is electrically connected to the first clock signal end CK1, the second beta control end ctr22 is electrically connected to the second node N2, the first beta input end in21 is electrically connected to the second power source signal input end V2, the second beta input end in22 is electrically connected to the shift register signal input end IN, the beta output end out21 is electrically connected to the first node N1; the second node control module 120 is configured to control a connection between the first beta input end in21 and the beta output end out21 according to a signal inputted from the first beta control end ctr21, or control a connection between the second beta input end in22 and the beta output end out21 according to a signal inputted by the second beta control end ctr22; the first output module 150 includes a first gamma control end ctr51, a second gamma control end ctr52, a first gamma input end in51, a second gamma input end in52, a gamma coupling end cp51 and a gamma output end out51, the first gamma control end ctr51 is electrically connected to the first node N1, the second gamma control end ctr52 and the gamma coupling end cp51 are electrically connected to the second node N2, the first gamma input end in51 is electrically connected to the first power source signal input end V1, the second gamma input end in52 is electrically connected to the second clock signal end CK2, the gamma output end out51 is electrically connected to the first signal output end POUT; the first output module 150 is configured to control a connection between the first gamma input end in51 and the gamma output end out51 according to a signal inputted from the first gamma control end ctr51, or control a connection between the second gamma input end in52 and the gamma output end out51 according to a signal inputted from the second gamma control end ctr52; the third node control module 130 includes a first delta control end ctr31, a second delta control end ctr32, a first delta input end in31, a second delta input end in32 and a delta output end out31, the first delta control end ctr31 is electrically connected to the first signal output end POUT, the second delta control end ctr32 is electrically connected to the third clock signal end CK2, the first delta input end in31 is electrically connected to the first power source signal input end V1, the second delta input end in32 is electrically connected to the second power source signal input end V2, the delta output end out31 is electrically connected to the third node N3; the third node control module 130 is configured to control a connection between the first delta input end in31 and the delta output end out31 according to a signal inputted from the first delta control end ctr31, or control a connection between the second delta input end in32 and the delta output end out31 according to a signal inputted from the second delta control end ctr32; the fourth node control module 140 includes a first epsilon control end ctr41, a second epsilon ctr41, a first epsilon input end in41, a second epsilon input end in42 and an epsilon output end out41, the first epsilon control end ctr41 is electrically connected to the third node N3, the second epsilon control end ctr42 is electrically connected to the first signal output end POUT, the first epsilon input end in41 is electrically connected to the first power source signal input end V1, the second epsilon input end in42 is electrically connected to the second power source signal input end V2, the epsilon output end out41 is electrically connected to the fourth node N4; the fourth node control node 140 is configured to control a connection between the first epsilon input end in41 and the epsilon output end out41 according to a signal inputted from the first epsilon control end ctr41, or control a connection between the second epsilon input end in42 and the epsilon output end out41 according to a signal inputted from the second epsilon control end ctr42; the second output module 160 includes a first zeta control end ctr61, a second zeta control end ctr62, a first zeta input end in61, a second zeta input end in62 and a zeta output end out61, the first zeta control end ctr61 is electrically connected to the fourth node N4, the second zeta control end ctr62 is electrically connected to the third node N3, the first zeta input end in61 is electrically connected to the first power source signal input end V1, the second zeta input end in62 is electrically connected to the second power source signal input end V2, the zeta output end out61 is electrically connected to the second signal output end NOUT; the second output module 160 is configured to control a connection between the first zeta input end in61 and the zeta output end out61 according to a signal inputted from the first zeta control end ctr61, or control a connection between the second zeta input end in62 and the zeta output end out62 according to a signal inputted from the second zeta control end ctr62; the storage module 170 includes a first eta end 171 and a second eta end 172; the first eta end 171 is electrically connected to the first node N1, the second eta end 172 is electrically connected to the first power source signal input end V1; the storage module 170 is configured to hold a stable potential at the first node N1; the coupling module 180 includes a first theta end 181 and a second theta end 182, the first theta end 181 is electrically connected to the third node N3, the second theta end 182 is electrically connected to the second signal output end NOUT; the coupling module 180 is configured to, in a case where a potential at the second signal input end NOUT varies, couple the potential at the second signal input end NOUT to the third node N3.

The first alpha control end ctr11 receives a potential at the first clock signal end CK1; when this potential is an enable level, the first node control module 110 transfers the low-level signal at the shift register signal input end IN to the second node N2; the second alpha control end ctr12 receives a potential at the second clock signal end CK2, the third alpha control end ctr13 receives a potential at the first node N1; when the second clock signal end CK2 and the first node N1 are at the enable level, the first node control module 110 transfers the high-level signal at the first power source signal input end V1 to the second node N2.

The first beta control end ctr21 receives the potential at the first clock signal end CK1; when this potential is the enable level, the second node control module 120 transfers the low-level signal at the second power source signal input end V2 to the first node N1; the second beta control end ctr22 receives the potential at the second node N2; when this potential is the enable level, the second node control module 120 transfers the low-level signal at the shift register signal input end IN to the first node N1.

The storage module 170 (also called "holding module 170") is configured to holding the stable potential at the first node N1.

The first delta control end ctr31 receives a potential at the first signal output end POUT; when this potential is the enable level, the third node control module 130 transfers the high-level signal at the first power source signal input end V1 to the third node N3; the second delta control end ctr32 receives the potential at the third clock signal end CK3; when this potential is the enable level, the third node control module 130 transfers the low-level signal at the second power source signal input end V2 to the third node N3.

The first epsilon control end ctr41 receives the potential at the third node N3; when this potential is the enable level, the fourth node control module 140 transfers the high-level signal at the first power source signal input end V1 to the fourth node N4; the second epsilon control end ctr42 receives the potential at the first signal output end POUT; when this potential is the enable level, the fourth node control module 140 transfers the low-level signal at the second power source signal input end V2 to the fourth node N4.

The first gamma control end ctr51 receives the potential at the first node N1; when this potential is the enable level, the first output module 150 transfers the high-level signal at the first power source signal input end V1 to the first signal output end POUT; the second gamma control end ctr52 receives the potential at the second node N2; when this potential is the enable level, the first output module 150 transfers the signal at the second clock signal end CK2 to the first signal output end POUT. At the same time, the coupling function of the gamma coupling end cp51 enables a signal transferring channel controlled by the second gamma control end ctr52 to turn on completely, such that the low-level signal at the second clock signal end CK2 is entirely transferred to the first signal output end POUT.

The first zeta control end ctr61 receives the potential at the fourth node N4; when this potential is the enable level, the second output module 160 transfers the high-level signal at the first power source signal input end V1 to the second signal output end NOUT; the second zeta control end ctr62 receives the potential at the third node N3; when this potential is the enable level, the second output module may transfers the low-level signal at the second power source signal input end V2 to the second signal output end NOUT. At the same time, because of the coupling function of the coupling module 180, when the potential signal at the second signal output end NOUT transitions from a high-level signal to a low-level signal, the amplitude of variance of the potential signal is coupled to the second zeta control end ctr62 of the second output module 160, such that the control signal at the second zeta control end ctr62 makes the signal transferring channel under the control of the control signal turn on completely, and thus the low-level signal inputted from the second power source signal input end V2 is entirely transferred to the second signal output end NOUT.

Thus, the low-level signal at the second power source signal input end V2 has no loss during transferring, which is beneficial to the complete cut-off of the transistor under the control of the second signal output end NOUT, so as to avoid leakage current loss. In other words, the shift register can implement cascade shifting of high-level and low-level signals without loss, i.e., can implement shifting of positive and negative levels; further, the shift register can completely turn off transistors in pixel driving circuits for PMOS and NMOS transistors, which avoids leakage current loss and is beneficial to improvement of image display effect of the display panel and the display device.

Exemplarily, the driving timing sequence of the shift register may be divided into five phases, the operating state of respective circuit components of the shift register is exemplarily described in phases by taking an example in which the enable level is low level.

In a first phase, the first clock signal end CK1 has a low-level signal, the shift register signal input end IN has a low-level signal, the second clock signal end CK2 has a high-level signal; at this moment, the first node control module transfers the low-level signal at the shift register signal input end IN to the second node N2, then the second gamma control end ctr52 of the first input module 150 is in an enable state, the first output module 150 transfers the high-level signal at the second clock signal end CK2 to the first signal output end POUT; at the same time, the second node control module 120 transfers the low-level signal at the shift register signal input end IN to the first node N1, then the first gamma control end ctr51 of the first output module 150 is also in the enable state, the first output module 150 transfers the high-level signal at the first power source signal input end V1 to the first signal output end POUT. In view of the above, the high-level signal is outputted at the first signal output end POUT.

The third clock signal end CK3 has a low-level signal, the third node control module 130 transfers the low-level signal at the second power source signal input end V2 to the third node N3, the second output module 160 transfers the low-level signal at the second power source signal input end V2 to the second signal output end NOUT. At the same time, the fourth node control module 140 transfers the high-level signal at the first power source signal input end V1 to the fourth node N4; based on this, the first beta control end ctr61 of the second output module 160 is at the high-level, i.e., disable level, the second output module 160 does not transfer the high-level signal at the first power source signal input end V1. In view of the above, the low-level signal is outputted at the second signal output end NOUT.

In a second phase, the first clock signal end CK1 has the high-level signal, the shift register signal input end IN has the high-level signal, the second clock signal end CK2 has the low-level signal; at this time, the first node control module 110 does not transfer the signal at the shift register signal input end IN, however because of the coupling function of the gamma coupling end of the first output module 150, the second node N2 is still held at the low level; the second node control module 120 transfers the high-level signal at the shift register signal input end IN to the first node N1; that is, the first gamma control end ctr5 of the first output module 150 is at the disable level, the level signal at the first power source signal input end V1 will not be transferred through the first output module 150; at the same time, since the second node N1 is held at the low level, the first output module 150 may transfer the low-level signal at the second clock signal end CK2 to the first signal output end POUT. Based on this, since the second node N2 is suspended, in consideration of the coupling function of the gamma coupling end cp51, when the first signal input end POUT jumps from the high level to the low level, a charge coupling quantity is generated and is coupled to the second node N2, which further lower the potential at the second node N2 from the low level in the first phase, therefore the transferring channel in the first output module 150 and under the control of the second node N2, i.e., the second gamma control end ctr52, completely turns on, so that the low level at the second clock signal end CK2 is completely transferred to the first signal output end POUT.

Based on this, the first delta control end ctr31 is in the enable state, the third node control module 130 transfers the high-level signal at the first power source signal input end V1 to the third node N3; then, the second zeta control end ctr62 is in the disable state, the second output module 160 does not transfer the low-level signal at the second power source signal input end V2. At the same time, the first signal output end POUT is at the low level, that is, the second epsilon control end ctr42 is at the low level, the fourth node control module 140 transfers the low-level signal at the second power source signal input end V2 to the fourth node N4, then the first zeta control end ctr61 is in the enable state, the second output module 160 transfers the high-level signal at the first power source signal input end V1 to the second signal output end NOUT.

In a third phase, the first clock signal end CK1 has the low-level signal, the shift register signal input end IN has the high-level signal, the first node control module 110 transfers the high-level signal at the shift register signal input end IN to the second node N2, at this time, the second beta control end ctr22 and the second gamma control end ctr52 are in the disable state; the first beta control end ctr21 is in the enable state, the second node control module 120 transfers the low-level signal at the second power source signal input end V2 to the first node N1; at this time, the first gamma control end ctr51 of the first output module 150 is in the enable state, the first output module 150 transfers the high-level signal at the first power source signal input end V1 to the first signal output end POUT.

The third clock signal end CK3 has the low-level signal, the second delta control end ctr32 is in the enable state, the third node control module 130 transfers the low-level signal at the second power source signal input end V2 to the third node N3; then the first epsilon control end ctr41 and the second zeta control end ctr62 are in the enable state, the fourth node control module 140 transfers the high-level signal at the first power source signal input end V1 to the fourth node N4 such that the first zeta control end ctr61 is in the disable state, and the second output module 160 transfers the low-level signal at the second power source signal input end V2 to the second signal output end NOUT. At the same time, on the basis of the second phase, the output signal at the second signal output end NOUT jumps from the high level to the low level, a charge coupling quantity is generated and is coupled to the first theta end 181 through the coupling function of the coupling module 180, which further lower the potential at the second zeta control end ctr62 from the potential in the second phase, therefore transferring channel in the second output module 160 and under the control of the second zeta control end ctr62 completely turns on, so that the low level at the second power source signal input end V2 is completely transferred to the second signal output end NOUT.

In a fourth phase, the first clock signal end CK1 has the high-level signal, the shift register signal input end IN has the high-level signal, the second node control module 120 cannot transfer the low-level signal at the second power source signal input end V2; however, since the storage module 170 is provided, the first node N1 may be held at the low level; then the third alpha control end ctr13 is in the enable state, the first node control module 110 transfers the high-level signal at the first power source input end V1 to the second node N2; then the second gamma control end ctr52 is in the disable state, the first output module 150 cannot transfer the low-level signal at the second power source signal input end V2. At the same time, since the first node N1 is at the low level, the first gamma control end ctr51 is in the enable state, the first output module 150 transfers the high-level signal at the first power source signal input end V1 to the first signal output end POUT.

At the same time, the potential at the third node N3 is held at the low-level state by the coupling module 180, the low-level signal at the second power source signal input end V2 is continuously outputted via the second signal output end NOUT.

The operating state in a fifth phase is the same as the operating state in the third phase.

Thus, the shift register can implement shifting of positive and negative levels while avoiding step-down.

Figure 17:
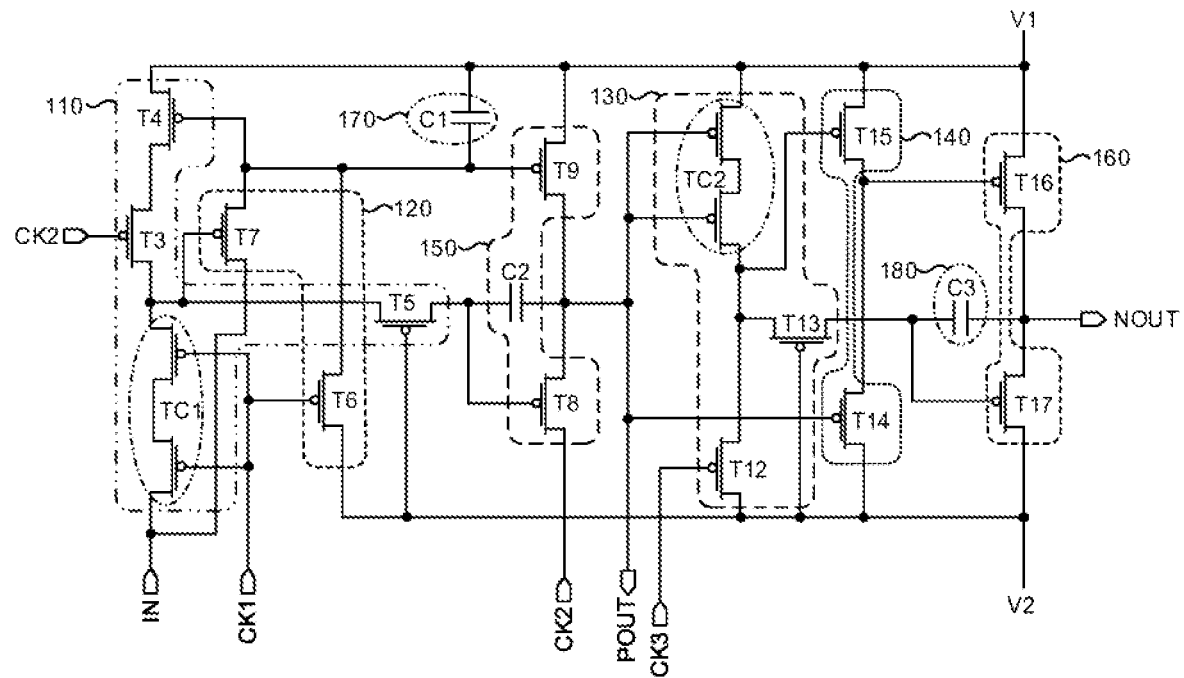
FIG. 17 is a circuit diagram of yet another shift register according to an embodiment of the present disclosure.
Figure 18:
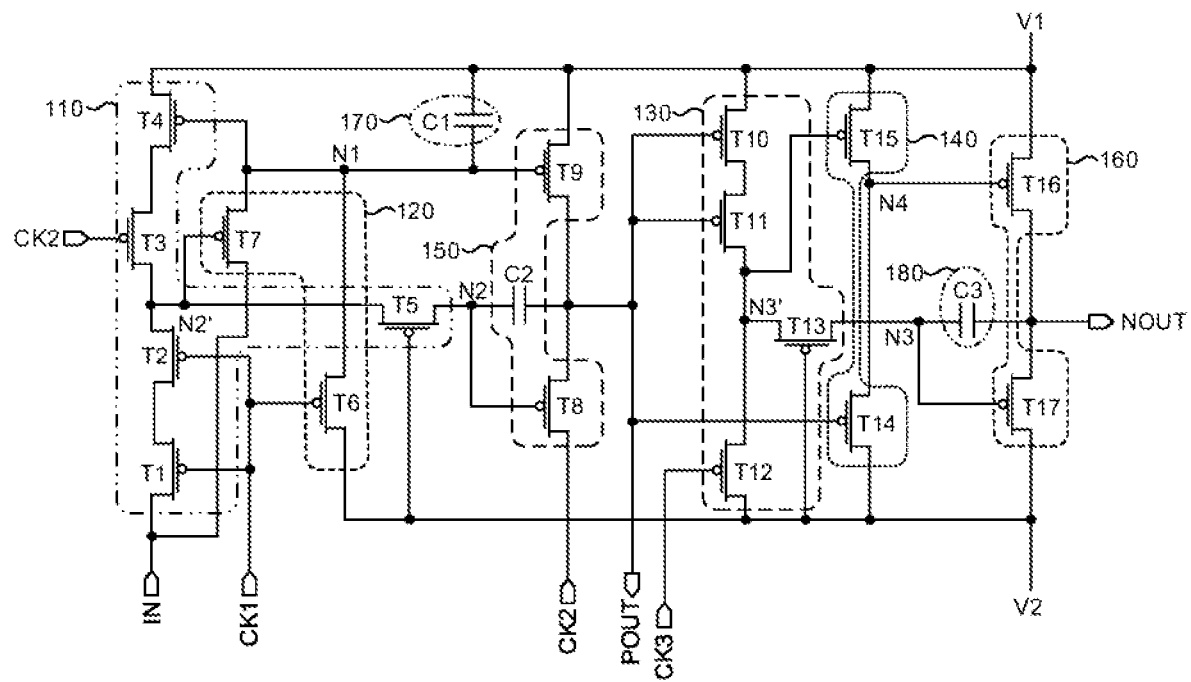
FIG. 18 is a circuit diagram of yet another shift register according to an embodiment of the present disclosure.

The shift register provided in the present disclosure is exemplarily described below in combination with specific circuit component structures of various circuit modules. FIG. 6 to FIG. 16, which merely exemplarily taking transistors or capacitors as examples, show structures of some circuit modules in a shift register. In the present disclosure, only FIG. 17 and FIG. 18 show structure diagram of circuit components in two types of shift registers. In other embodiments, various circuit components may be arbitrarily combined according to actual requirements for the shift register, which is within the scope of the present disclosure, and will not be described or limited here.

Figure 6:
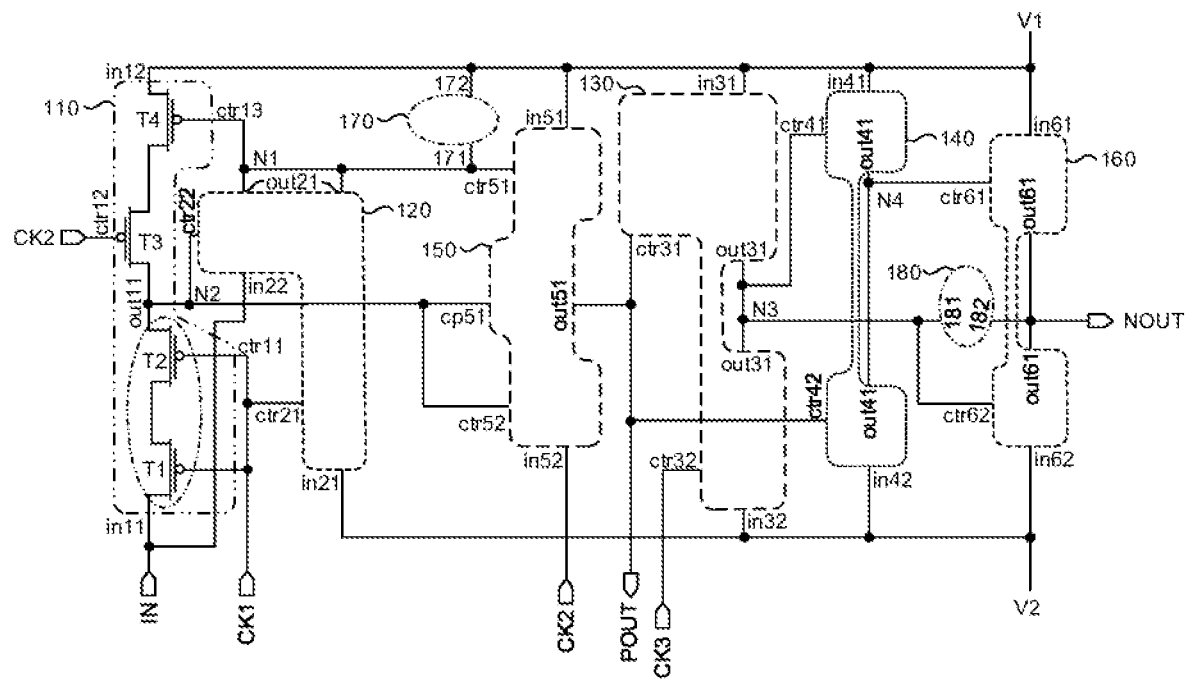
FIG. 6 is a circuit diagram of another shift register according to an embodiment of the present disclosure.

Based on FIG. 5, in an embodiment, referring to FIG. 6, the first node control module 110 includes a first transistor T1, a second transistor T2, a third transistor T3 and a fourth transistor T4; a gate electrode of the first transistor T1 and a gate electrode of the second transistor T2 are used as the first alpha control end ctr11; a first electrode of the first transistor T1 is used as the first alpha input end inn, a second electrode of the first transistor T1 is electrically connected to a first electrode of the second transistor T2, a second electrode of the second transistor T2 and a first electrode of the third transistor T3 are electrically connected to the alpha output end out11, a gate electrode of the third transistor T3 is used as the second alpha control end ctr12, a second electrode of the third transistor T3 is electrically connected to a first electrode of the fourth transistor T4, a gate electrode of the fourth transistor T4 is used as the third alpha control end ctr13, a second electrode of the third transistor T3 is used as the second alpha input end in12.

In this way, in combination with the context, the signal at the first clock signal end CK1 controls an on-off state of the first transistor T1 and the second transistor T2, the signal at the second clock signal end CK2 controls an on-off state of the third transistor T3, a potential at the first node N1 controls an on-off state of the fourth transistor T4; base on this, when a low-level signal is inputted at the first clock signal end CK1, the first node control module 110 may transfer a low-level or high-level signal at the shift register signal input end IN to the second node N2 through the first transistor T1 and the second transistor T2; and when a low-level signal is inputted at the second clock signal end CK2 and the first node N1 has a low-level signal, a high-level signal at the first power source signal input end V1 is transferred to the second node N2 through the fourth transistor T4 and the third transistor T3.

Exemplarily, in the first phase, the first clock signal end CK1 has the low-level signal, the shift register signal input end IN has the low-level signal, the second clock signal end CK2 has the high-level signal; at this time, the first transistor T1 and the second transistor T2 turn on, the low-level signal at the shift register signal input end IN is transferred to the second node N2 through the first transistor T1 and the second transistor T2; the third transistor T3 is cut off, and the signal transferring path to which the third transistor T3 belongs is cut off.

Exemplarily, in the second phase, the first clock signal end CK1 has the high-level signal, the shift register signal input end IN has the high-level signal, the second clock signal end CK2 has the low-level signal; at this time, the first transistor T1 and the second transistor T2 is cut off; because of the coupling function of the gamma coupling end cp51 of the first output module 150, the second node N2 is still held at the low level, then the second node control module 120 transfers the high-level signal at the shift register signal input end IN to the first node N1, the fourth transistor T4 is cut off, and the signal transferring path to which the third transistor T4 belongs is cut off.

Exemplarily, in the third phase, the first clock signal end CK1 has the low-level signal, the shift register signal input end IN has the high-level signal, the second clock signal end CK2 has the high-level signal; at this time, the second node control module 120 transfers the low-level signal at the second power source signal input end V2 to the first node N1; the first transistor T1 and the second transistor T2 turn on, the high-level signal at the shift register signal input end IN is transferred to the second node N2 through the first transistor T1 and the second transistor T2; the third transistor T3 is cut off, and the signal transferring path to which the third transistor T3 belongs is cut off.

Exemplarily, in the fourth phase, the first time clock signal end CK1 has the high-level signal, the shift register signal input end IN has the high-level signal, the second clock signal end CK2 has the low-level signal; at this time, the first transistor T1 and the second transistor T2 are cut off; because of the coupling function of the gamma coupling end cp51 of the first output module 150, the second node N2 is still held at the high level; because of the coupling function of the storage module 170, the first node N1 is held at the low level, then the fourth transistor T4 turns on, at the same time, the low-level signal at the second clock signal end CK2 turns on the third transistor T3, therefore the high-level signal at the first power source signal input end V1 is transferred to the second node N2 through the fourth transistor T4 and the third transistor T3.

In view of the above, the potential at the second node N2 may be controlled.

In an embodiment, based on FIG. 6, the actual product structure of the first transistor T1 and the second transistor T2 may be one double-gate transistor. Based on this, referring to FIG. 7, the first node control module 110 includes a first double-gate transistor TC1, a third transistor T3 and a fourth transistor T4; a gate electrode of the first double-gate transistor TC1 is used as the first alpha control end ctr11; a first electrode of the first double-gate transistor TC1 is used as the first alpha input end in11, a second electrode of the first double-gate transistor TC1 and a first electrode of the third transistor T3 are electrically connected to the alpha output end out11, a gate electrode of the third transistor T3 is used as the second alpha control end ctr12, a second electrode of the third transistor T3 is electrically connected to a first electrode of the fourth transistor T4, a gate electrode of the fourth transistor T4 is used as the third alpha control end ctr13, a second electrode of the third transistor T3 is used as the second alpha input end in12.

This configuration can reduce the leakage current, so as to enhance the performance of the shift register.

The on-off state of the first double-gate transistor TC1 is controlled by the potential signal inputted from the first clock signal end CK1, the on-off state of the third transistor T3 is controlled by the potential signal inputted from the second clock signal end CK2, the on-off state of the fourth transistor T4 is controlled by the potential signal at the first node N1.

Exemplarily, when the signal inputted from the first clock signal end CK1 is the low-level signal, the first double-gate transistor TC1 turns on, the first node control module 110 transfers the potential signal at the shift register signal input end IN to the first node through the first double-gate transistor TC1. When the signal inputted from the second clock signal end CK2 is the low-level signal and the potential at the first node N1 is the low level, the first node control module 110 transfers the high-level signal at the first power source signal input end V1 to the second node N2 through the fourth transistor T4 and the third transistor T3. In this way, the potential at the second node N2 may be controlled.

Figure 7:
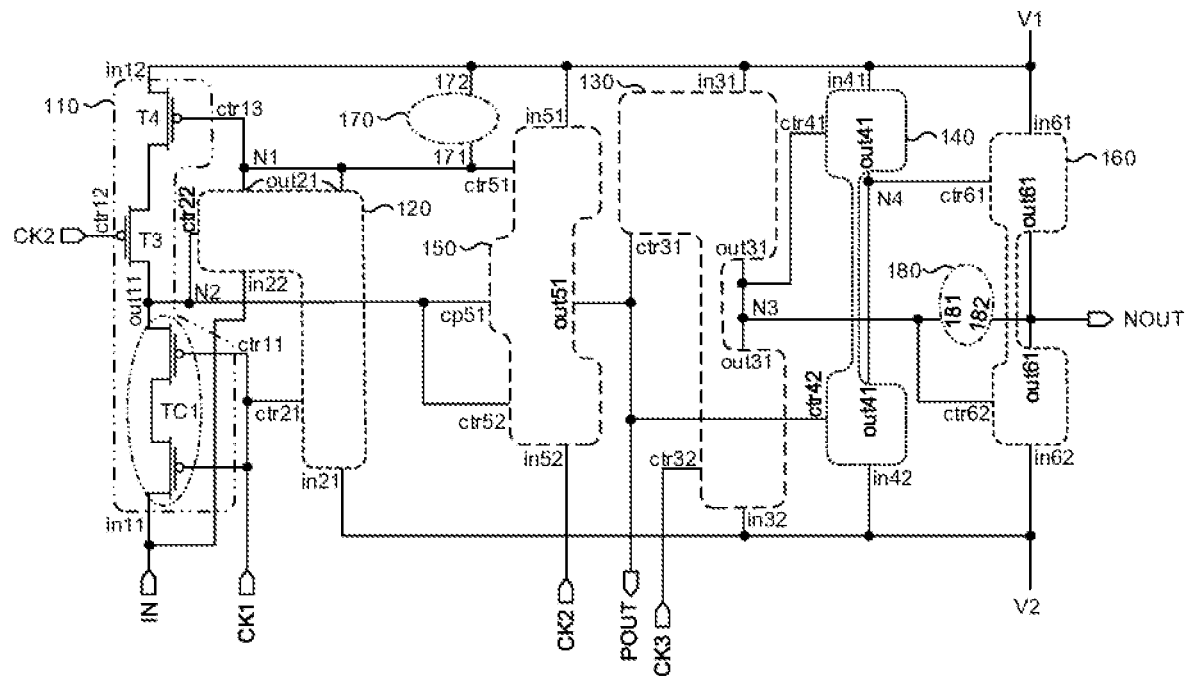
FIG. 7 is a circuit diagram of yet another shift register according to an embodiment of the present disclosure.
Figure 8:
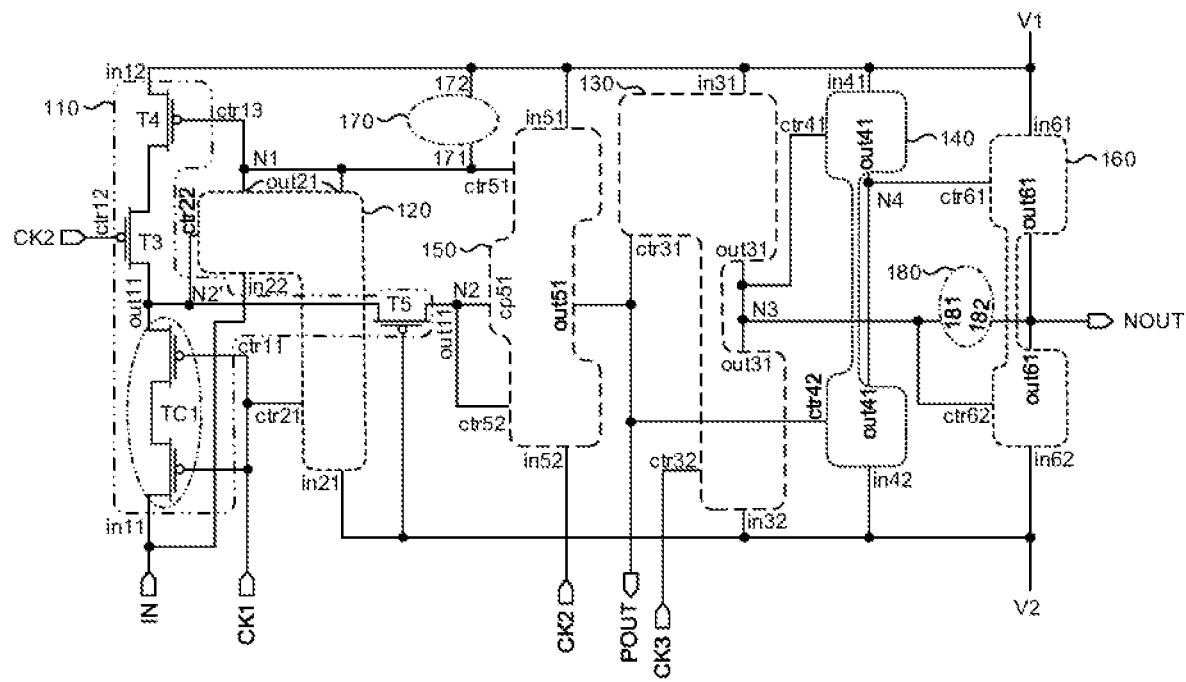
FIG. 8 is a circuit diagram of yet another shift register according to an embodiment of the present disclosure.

Based on FIG. 6 and FIG. 7, in an embodiment, referring to FIG. 8, the first node control module 110 further includes a fifth transistor T5, the first electrode of the third transistor T3 is electrically connected to a first electrode of the fifth transistor T5, a second electrode of the fifth transistor T5 is used as the alpha output end out'', a gate electrode of the fifth transistor is electrically connected to the second power source signal input end V2.

The potential signal at the second power source signal input end V2 is the low-level signal, this low-level signal makes the fifth transistor T5 normally on, in this way, when the potential at a second intermediate node N2' varies, the potential at the second node N2 varies accordingly; at the same time, when the variance of the potential at the second node N2 has smaller influence on the potential at the second intermediate node N2', this is beneficial to the protection of other transistors in the first node control module 110.

It should be noted that, FIG. 8 shows the first node control module 110 further including the fifth transistor T5 by taking the first node control module 110 including the first double-gate transistor TC1 as an example; in other embodiments, when the first node control module 110 includes the first transistor T1 and the second transistor T2, the first node control module 110 may further include the fifth transistor T5, which will not be illustrated in a separate figure in the present disclosure and can be understood by the analogy of FIG. 8.

Figure 9:
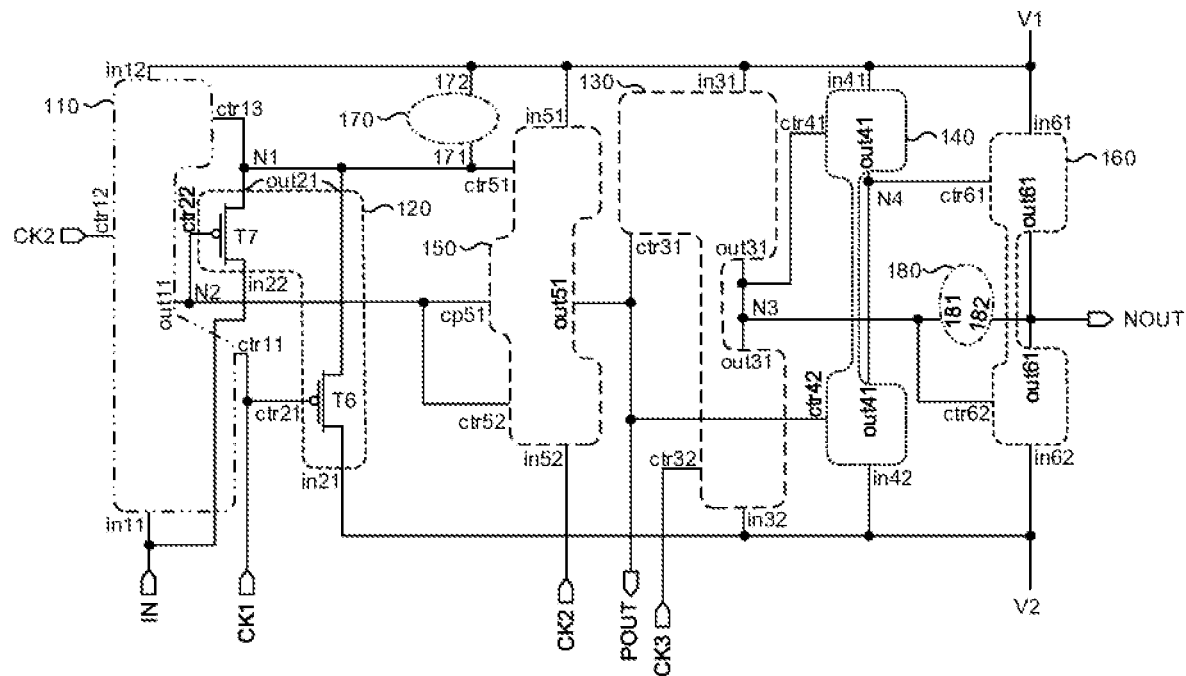
FIG. 9 is a circuit diagram of yet another shift register according to an embodiment of the present disclosure.

Based on FIG. 5, in an embodiment, referring to FIG. 9, the second node control module 120 includes a sixth transistor T6 and a seventh transistor T7; a gate electrode of the sixth transistor T6 is used as the first beta control end ctr21, a first electrode of the sixth transistor T6 is used as the first beta input end in21, a gate electrode of the seventh transistor T7 is used as the second beta control end ctr22, a first electrode of the seventh transistor is used as the second beta input end in22, a second electrode of the sixth transistor T6 and a second electrode of the sixth transistor T7 are used as the beta output end out21.

The on-off state of the sixth transistor T6 is controlled by the potential signal inputted from the first clock signal end CK1, the on-off state of the seventh transistor T7 is controlled by the potential signal at the second node N2.

Exemplarily, when the potential signal inputted from the first clock signal end CK1 is the low-level signal, the sixth transistor T6 turns on, the second node control module 120 transfers the low-level signal at the second power source signal input end V2 to the first node N1 through the sixth transistor T6; when the potential at the second node N2 is the low level, the seventh transistor T7 turns on, the second node control module 120 transfers the potential signal at the shift register signal input end IN to the first node N1 through the seventh transistor T7. In this way, the potential at the first node N1 can be controlled.

Figure 10:
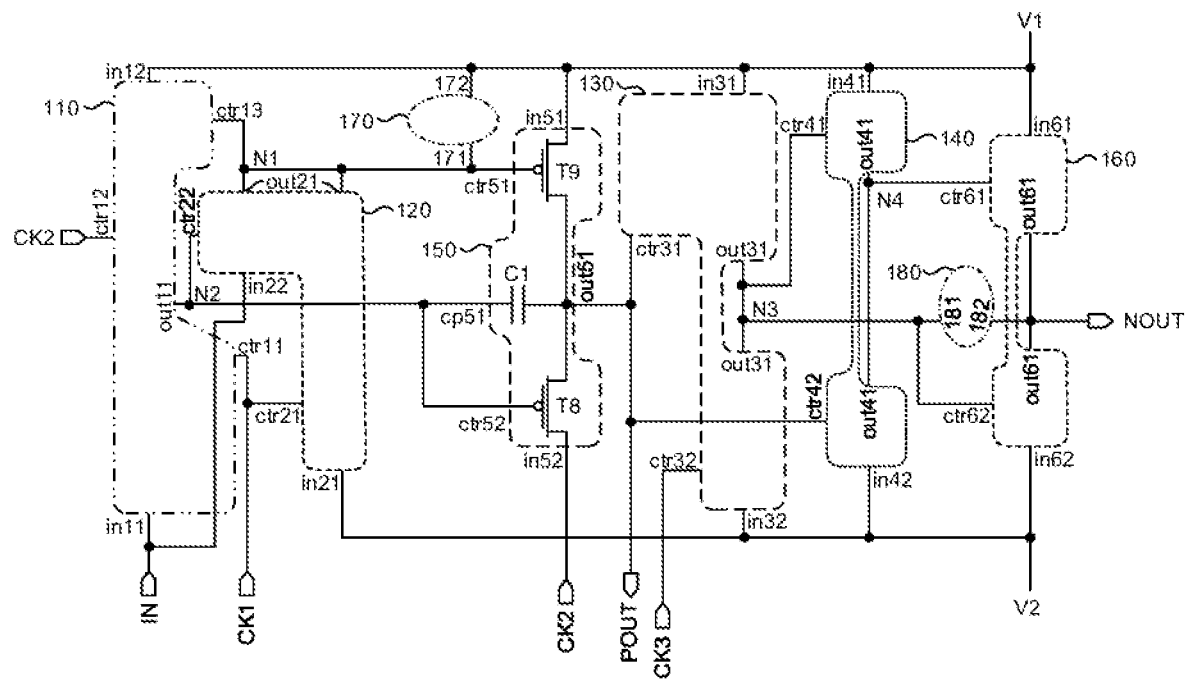
FIG. 10 is a circuit diagram of yet another shift register according to an embodiment of the present disclosure.

Based on FIG. 5, in an embodiment, referring to FIG. 10, the first output module 150 includes an eighth transistor T8 and a ninth transistor T9; a gate electrode of the eighth transistor T8 is used as the second gamma control end ctr52, a first electrode of the eighth transistor T8 is used as the second gamma input end in52, a gate electrode of the ninth transistor T9 is used as the first gamma control end ctr51, a first electrode of the ninth transistor T9 is used as the first gamma input end in51, a second electrode of the eighth transistor T8 and a second electrode of the ninth transistor T9 are used as the gamma output end out51.

The on-off state of the eighth transistor T8 is controlled by the potential signal at the second node N2, the on-off state of the ninth transistor T9 is controlled by the potential signal at the first node N1.

Exemplarily, when the potential at the second node N2 is at the low level, the eighth transistor T8 turns on, the first output module 150 transfers the signal at the second clock signal end CK2 to the first signal output end POUT. When the potential at the first node N1 is at the low level, the ninth transistor T9 turns on, the first output module 150 transfers the high-level signal at the first power source signal input end V1 to the first signal output end POUT. This can implement output of the high-level signal and the low-level signal.

Based on FIG. 5, in an embodiment, referring to FIG. 10, the first output module 150 further includes a first capacitor C1; a first end of the first capacitor C1 is used as the gamma coupling end cp51 connected to the gate electrode of the eighth transistor T8, a second end of the first capacitor C1 is also used as the gamma output end out51.

The first capacitor C1 on one hand is used to hold the potential at the second node N2, and on the other hand is used to couple the charge coupling quantity at the first signal output end POUT to the gamma coupling end cp51.

Exemplarily, in the second phase, two signal transferring channels in the first node control module 110 are both turned off, at this time, the first capacitor C1 has a function of potential holding, i.e., holding the low level at the second node N2. At the same time, the gate electrode of the eighth transistor T8 is at the low level, the eighth transistor T8 turns on, the first output module 150 transfers the low-level signal at the second clock signal end CK2 to the first signal output end POUT. Based on this, since the second node N2 is suspended, in consideration of the coupling function of the first capacitor C1, when the first signal input end POUT jumps from the high level to the low level, a charge coupling quantity is generated at the second end of the first capacitor C1 and is coupled to the first end of the first capacitor C1, i.e., the second node N2, which further lower the potential at the second node N2 from the low level in the previous phase, therefore the transferring channel, i.e., the eighth transistor T8, in the first output module 150 and under the control of the second node N2, i.e., the second gamma control end ctr52, completely turns on, so that the low level at the second clock signal end CK2 is completely transferred to the first signal output end POUT. Base on this, it is impossible to output a lower potential, and the step phenomenon during the low-level shifting is thus avoided.

Figure 11:
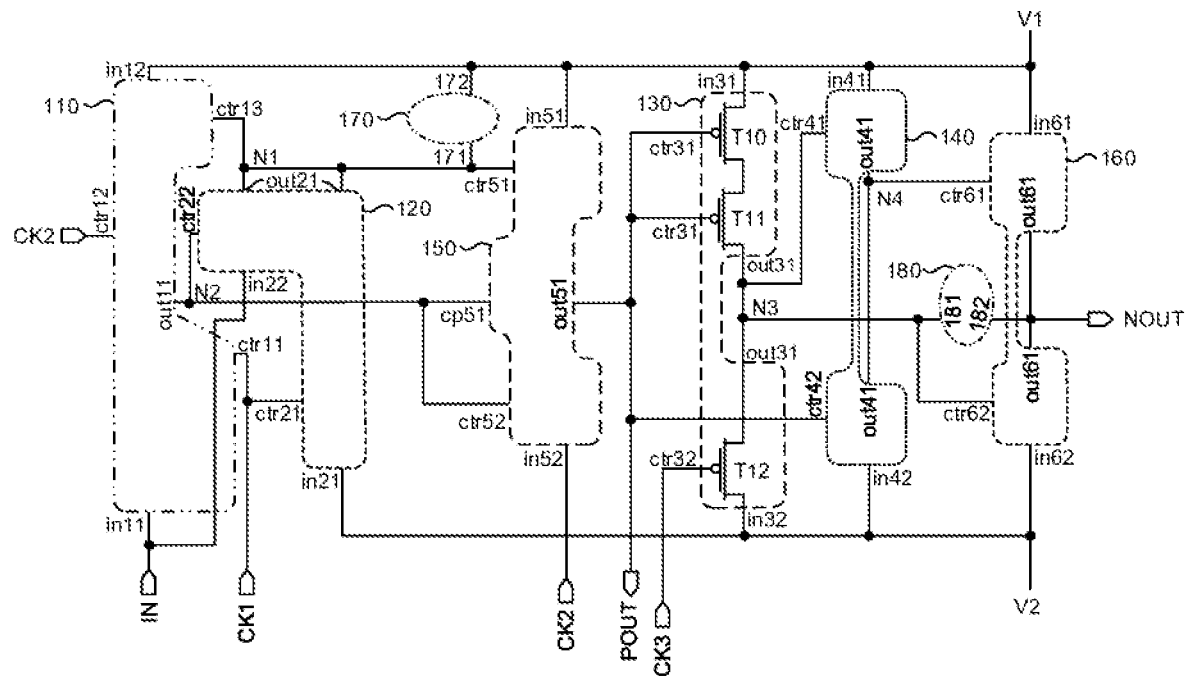
FIG. 11 is a circuit diagram of yet another shift register according to an embodiment of the present disclosure.

Based on FIG. 5, in an embodiment, referring to FIG. 11, the third node control module 130 includes a tenth transistor T10, an eleventh transistor T11 and a twelfth transistor T12; a gate electrode of the tenth transistor T10 and a gate electrode of the eleventh transistor T11 are used as the first delta control end ctr31, a first electrode of the tenth transistor T10 is used as the first delta input end in31, a second electrode of the tenth transistor T10 is electrically connected to a first electrode of the eleventh transistor T11, a gate electrode of the twelfth transistor T12 is used as the second delta control end ctr32, a first electrode of the twelfth transistor T12 is used as the second delta input end in32, a second electrode of the eleventh transistor T11 and a second electrode of the twelfth transistor T12 are connected to the delta output end out31.

The on-off state of the tenth transistor T10 and the eleventh transistor T11 are controlled by the potential signal at the first signal output end POUT, the on-off state of the twelfth transistor T12 is controlled by the potential signal at the third clock signal end CK3.

Exemplarily, when the low-level signal is outputted from the first signal output end POUT, the tenth transistor T10 and the eleventh transistor T11 turn on, the third node control module 130 transfers the high-level signal at the first power source signal input end V1 to the third node N3 through the tenth transistor T10 and the eleventh transistor T11; when the low-level signal is inputted from the third clock signal end CK3, the twelfth transistor T12 turns on, the third node control module 130 transfers the low-level signal at the second power source signal input end V2 to the third node N3 through the twelfth transistor T12. In this way, the potential signal at the third node N3 can be controlled.

In an embodiment, based on FIG. 11, the actual product structure of the tenth transistor T10 and the eleventh transistor T11 is a double-gate transistor. Based on this, referring to FIG. 12, the third node control module 130 includes a second double-gate transistor TC2 and the twelfth transistor T12; a gate electrode of the second double-gate transistor TC2 is used as the first delta control end ctr31, a first electrode of the second double-gate transistor TC2 is used as the first delta input end in31, the gate electrode of the twelfth transistor T12 is used as the second delta control end ctr32, the first electrode of the twelfth transistor T12 is used as the second delta input end in32, a second electrode of the second double-gate transistor TC2 and the second electrode of the twelfth transistor T12 are electrically connected to the delta output end out31.

This configuration can avoid a large leakage current, so as to enhance the performance of the shift register.

The on-off state of the second double-gate transistor TC2 is controlled by the potential signal at the first signal output end POUT, the on-off state of the twelfth transistor T12 is controlled by the potential signal at the third clock signal end CK3.

Exemplarily, when the low-level signal is outputted from the first signal output end POUT, the second double-gate transistor TC2 turns on, the third node control module 130 transfers the high-level signal at the first power source signal input end V1 to the third node N3 through the second double-gate transistor TC2; when the low-level signal is inputted from the third clock signal end CK3, the twelfth transistor T12 turns on, the third node control module 130 transfers the low-level signal at the second power source signal input end V2 to the third node N3 through the twelfth transistor T12. In this way, the potential signal at the third node N3 can be controlled.

Figure 12:
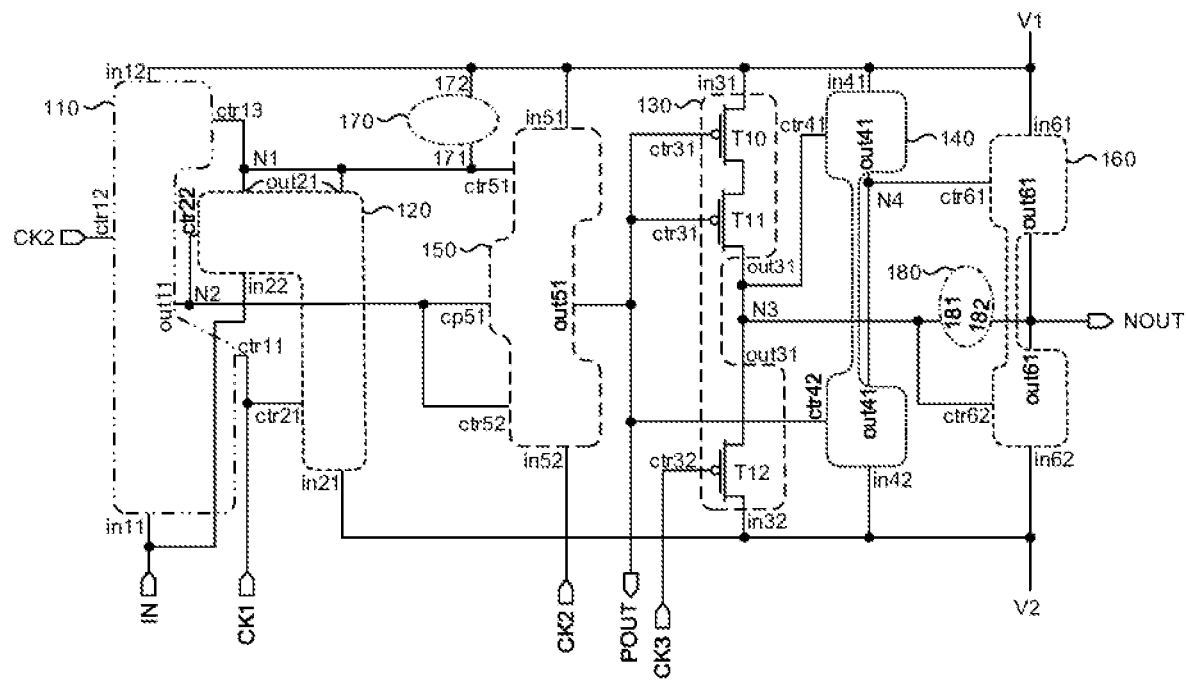
FIG. 12 is a circuit diagram of yet another shift register according to an embodiment of the present disclosure.
Figure 13:
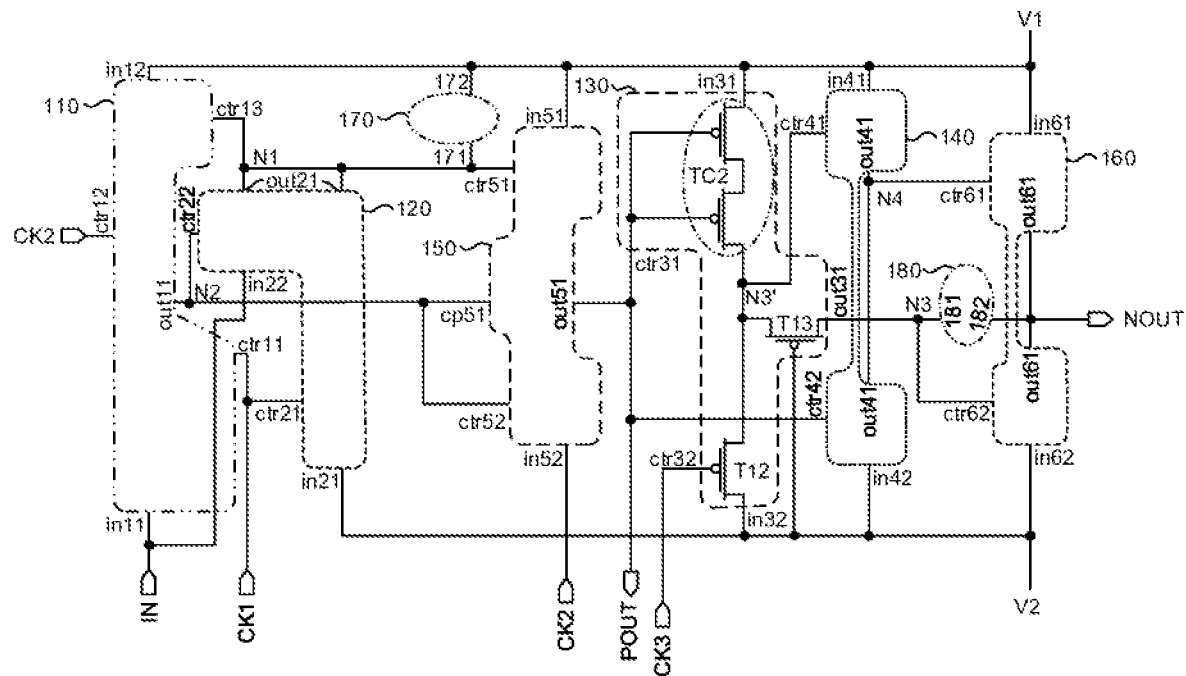
FIG. 13 is a circuit diagram of yet another shift register according to an embodiment of the present disclosure.

Based on FIG. 11 and FIG. 12, in an embodiment, referring to FIG. 13, the third node control module 130 further includes a thirteenth transistor T13; a first electrode of the thirteenth transistor T13 is electrically connected to the second electrode of the twelfth transistor T12, a second electrode of the thirteenth transistor T13 is used as the delta output end out31, a gate electrode of the thirteenth transistor T13 is electrically connected to the second power source signal input end V2.

The potential signal at the second power source signal input end V2 is the low-level signal, this low-level signal makes the thirteenth transistor T13 normally on; in the fourth phase, the thirteenth transistor T13 is used as a normally-open transistor and avoid the influence of a third intermediate node N3' on the third node N3, i.e., even if the second double-gate transistor TC2 and the twelfth transistor T12 have leakage currents and the potential at the third intermediate node N3' increases, the existence of the thirteenth transistor T13 has a function of potential blocking, so as to hold the potential at the third node N3 unchanged, such that the transferring channel under the control of the second zeta control end ctr62 is not affected, the low-level signal at the second power source signal input end V2 can be outputted at the second signal output end NOUT, which is beneficial to holding stable low level at the second signal output end NOUT.

It should be noted that, FIG. 13 shows the third node control module 130 further including the thirteenth transistor T13 by taking the first node control module 130 including the second double-gate transistor TC2 as an example; in other embodiments, when the third node control module 130 includes the tenth transistor T10 and the eleventh transistor T11, the third node control module 130 may further include the thirteenth transistor T13, which will not be illustrated in a separate figure in the present disclosure and can be understood by the analogy of FIG. 13.

Figure 14:
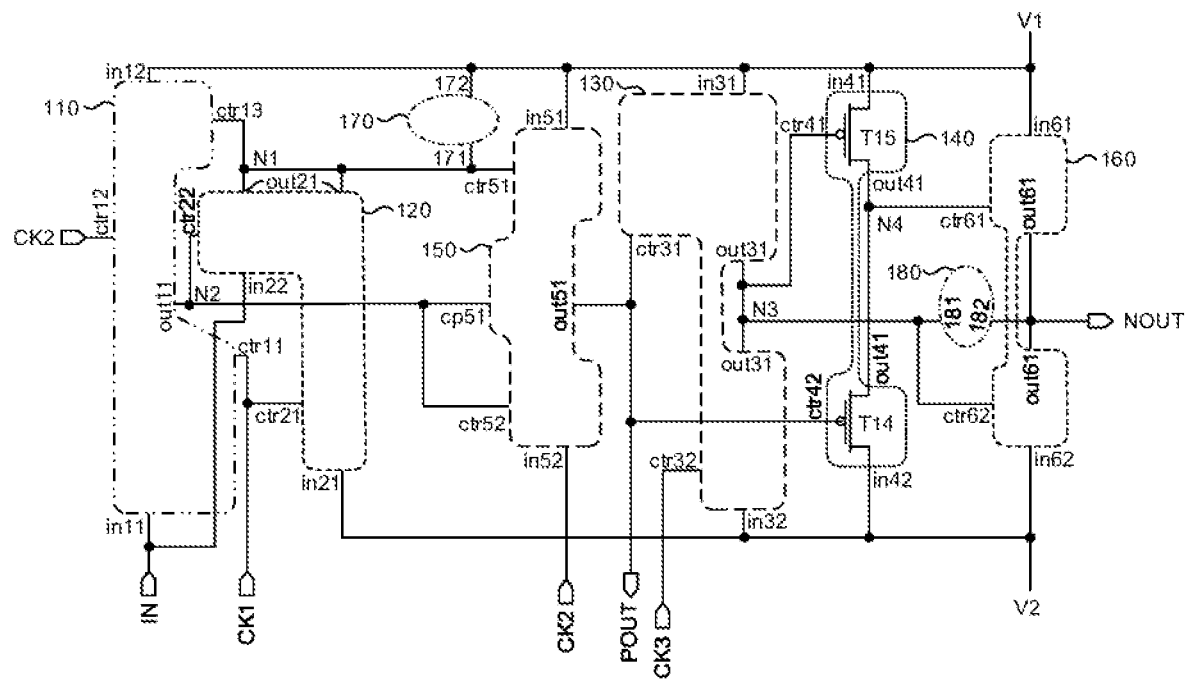
FIG. 14 is a circuit diagram of yet another shift register according to an embodiment of the present disclosure.

Based on FIG. 5, in an embodiment, referring to FIG. 14, the fourth node control module 140 includes a fourteenth transistor T14 and a fifteenth transistor T15; a gate electrode of the fourteenth transistor T14 is used as the second epsilon control end ctr42, a first electrode of the fourteenth transistor T14 is used as the second epsilon input end in42, a gate electrode of the fifteenth transistor T15 is used as the first epsilon control end ctr41, a first electrode of the fifteenth transistor T15 is used as the first epsilon input end in41, a second electrode of the fourteenth transistor T14 and a second electrode of the fifteenth transistor T15 are used as the epsilon output end out41.

The on-off state of the fourteenth transistor T14 is controlled by the potential signal at the first signal output end POUT, the on-off state of the fifteenth transistor T15 is controlled by the potential signal at the third node N3.

Exemplarily, when the low-level signal is outputted at the first signal output end POUT, the fourteenth transistor T14 turns on, the fourth node control module 140 transfers the low-level signal at the second power source signal input end V2 to the fourth node N4 through the fourteenth transistor T14; when the potential at the third node N3 is the low level, the fifteenth transistor T15 turns on, the fourth node control module 140 transfers the high-level signal at the first power source signal input end V1 to the fourth node N4 through the fifteenth transistor T15. In this way, the potential signal at the fourth node N4 can be controlled.

Figure 15:
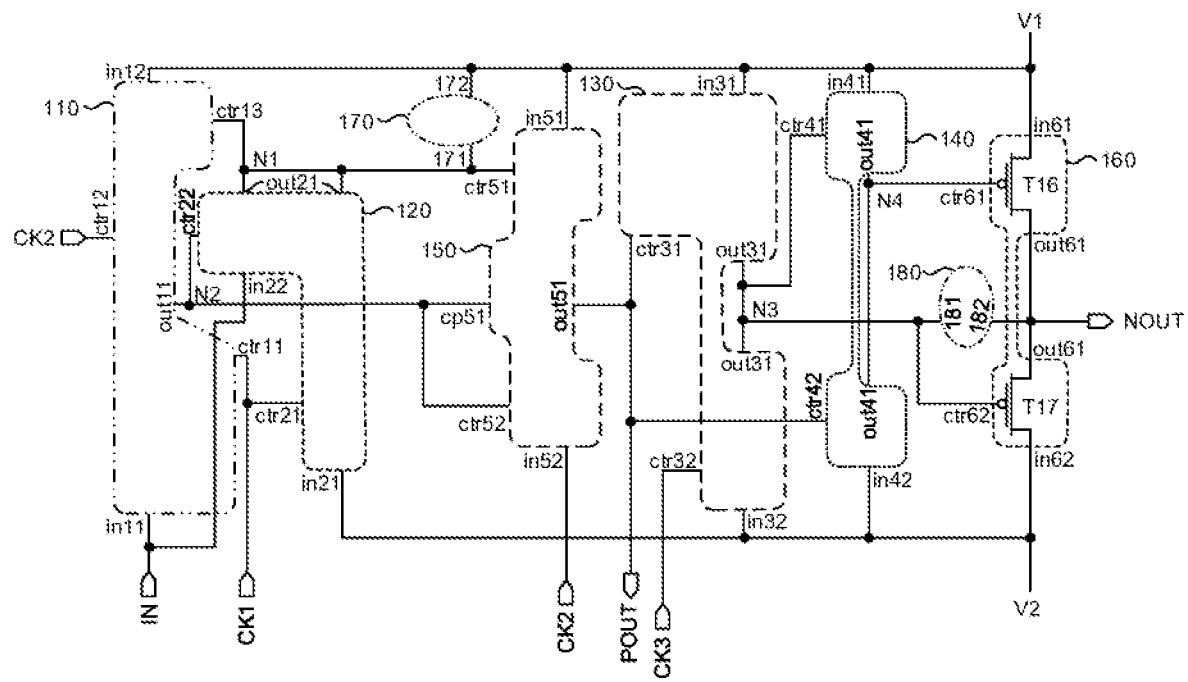
FIG. 15 is a circuit diagram of yet another shift register according to an embodiment of the present disclosure.

Based on FIG. 5, in an embodiment, referring to FIG. 15, the second output module 1y60 includes a sixteenth transistor T16 and a seventeenth transistor T17; a gate electrode of the sixteenth transistor T16 is used as the first zeta control end ctr61, a first electrode of the sixteenth transistor T16 is used as the first zeta input end in61, a gate electrode of the seventeenth transistor T17 is used as the second zeta control end ctr62, a first electrode of the seventeenth transistor T17 is used as the second zeta input end in62, a second electrode of the sixteenth transistor T16 and a second electrode of the seventeenth transistor T17 are used as the zeta output end out61.

The on-off state of the sixteenth transistor T16 is controlled by the potential signal at the fourth node N4, the on-off state of the seventeenth transistor T17 is controlled by the potential signal at the third node N3.

Exemplarily, when the potential at the fourth node N4 is the low level, the sixteenth transistor T16 turns on, the second signal output module 160 transfers the high-level signal at the first power source input end V1 to the second signal output end NOUT through the sixteenth transistor T16; when the potential at the third node N3 is the low level, the thirteenth transistor T17 turns on, the second output module 160 transfers the low-level signal at the second power source signal input end V1 to the second signal output end NOUT through the seventeenth transistor T17.

Figure 16:
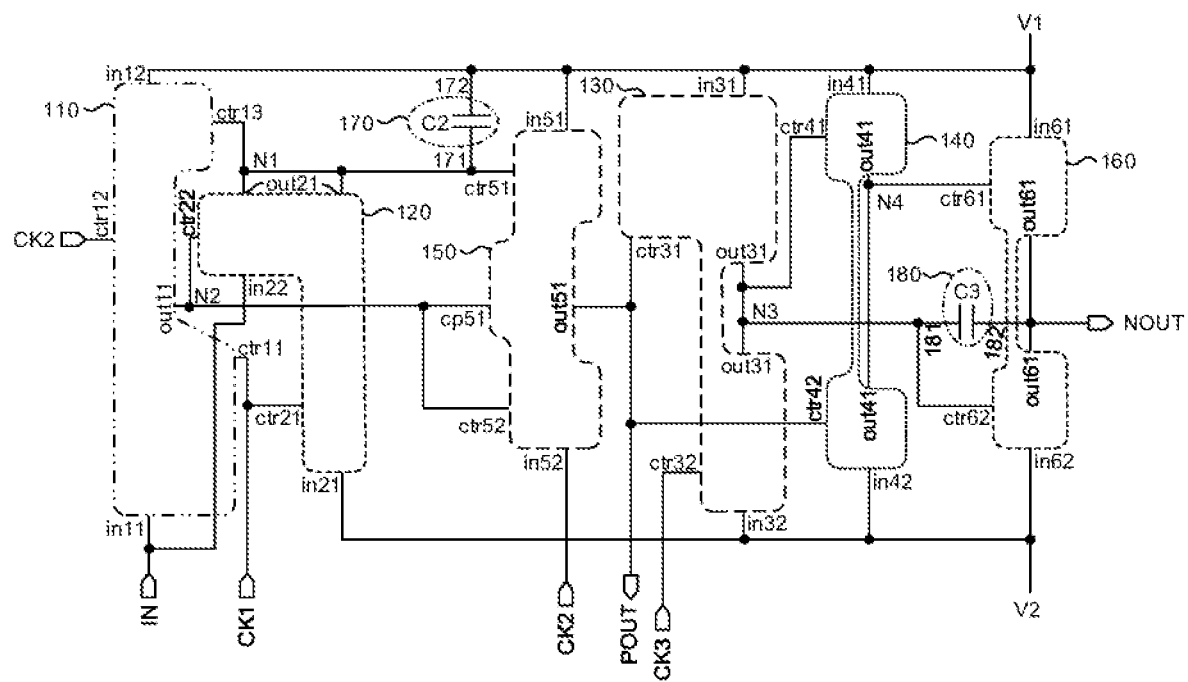
FIG. 16 is a circuit diagram of yet another shift register according to an embodiment of the present disclosure.

Based on FIG. 5, in an embodiment, referring to FIG. 16, the storage module 170 includes a second capacitor C2; a first end of the second capacitor C2 is used as the first eta end 171, a second end of the second capacitor C2 is used as the second eta end 172.

In the fourth phase, the storage module 170 holds the stable potential at the first node N1 through the second capacitor C2.

Based on FIG. 5, in an embodiment, with continuing reference to FIG. 16, the coupling module 180 includes a third capacitor C3; a first end of the third capacitor C3 is used as the first theta end 181, a second end of the third capacitor C3 is used as the second theta end 182.

In the third end, since the charge coupling quantity at the second end of the third capacitor C3 is coupled to the first end of the third capacitor C3, the potential at the third node N3 is further lowered based on the low level in the second phase, such that the signal transferring channel in the second output module 160 and under the control of the second zeta control end ctr62 completely turns on, and the low-level signal at the second power source signal input end V2 can be completely outputted to the second signal output end NOUT.

Thus, the low-level signal at the second power source signal input end V2 has no loss during transferring, which is beneficial to the complete cut-off of the transistor under the control of the second signal output end NOUT, so as to avoid leakage current loss. In other words, the shift register can implement cascade shifting of high-level and low-level signals without loss, i.e., can implement shifting of positive and negative levels; further, the shift register can completely turn off transistors in pixel driving circuits for PMOS and NMOS transistors, which avoids leakage current loss and is beneficial to improvement of image display effect of the display panel and the display device.

Based on the above embodiments, the circuit components diagram of the shift register may be as shown in FIG. 17 or FIG. 18, in which the only difference is that, each of the first node control module 110 and the third node control module 130 includes a double-gate transistor in FIG. 17, while the transistors in the first node control module 110 and the third node control module 130 are all single-gate transistors; the circuit component structures of other modules are the same, which can be understood with reference to the above description and will not be detailed here.

In other embodiments, the shift register may also be in the form of combinations of other circuit components known to the skilled person in the art, which will not be detailed or limited here.

Figure 19:
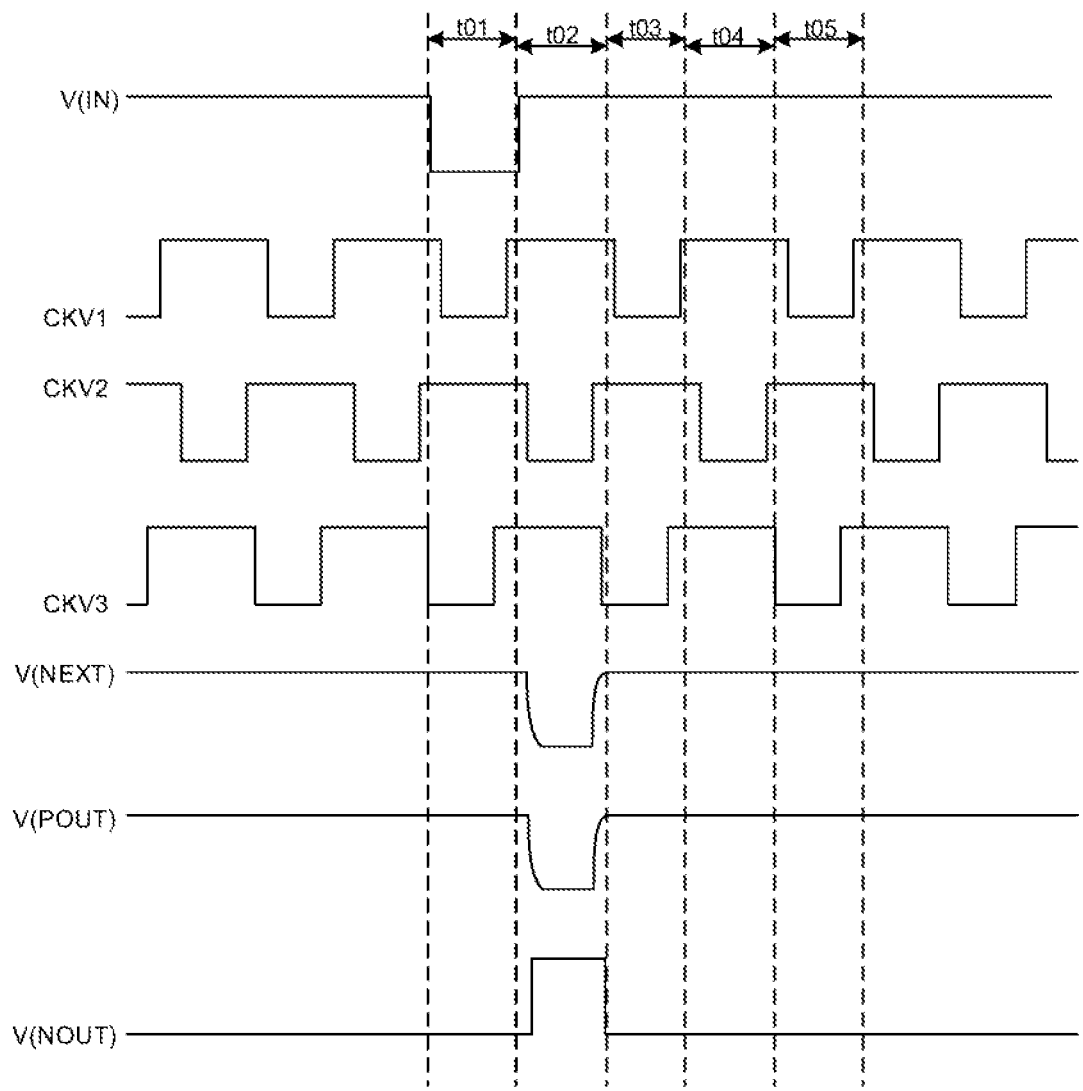
FIG. 19 is a schematic diagram illustrating a driving timing sequence of a shift register according to an embodiment of the present disclosure.

The operating principle (also called operating process) of the shift register provided in the present disclosure will be exemplarily described below by taking FIG. 18 as an example and in combination with FIG. 19 and FIG. 20. FIG. 19 shows potential at respective signal ends and output ends in different phases, FIG. 20 shows oscillograph and potential at all nodes at different moments.

Figure 20:
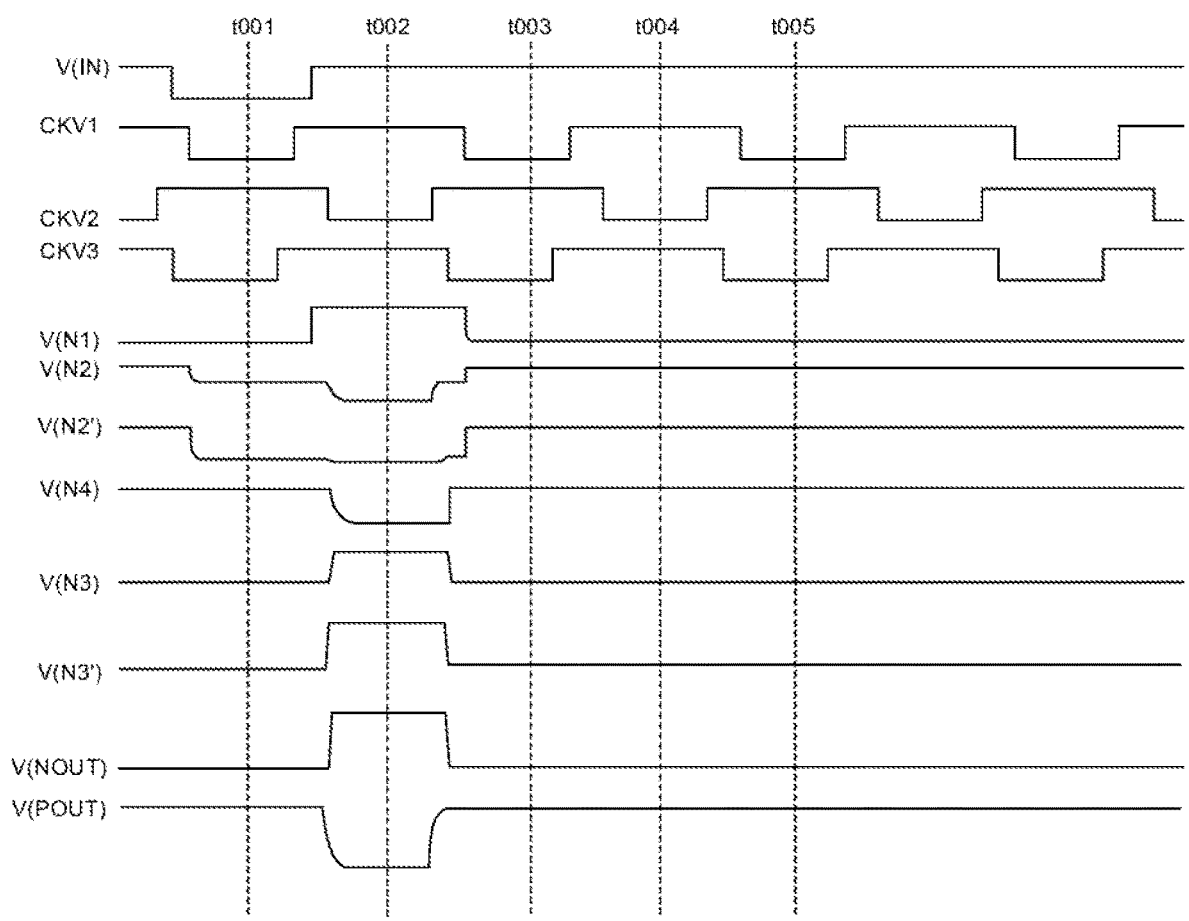
FIG. 20 is a schematic diagram illustrating a driving timing sequence of another shift register according to an embodiment of the present disclosure.

Referring to FIG. 19 and FIG. 20, V(IN) represents a timing sequence signal at the shift register signal input end IN, CKV1 represents a timing sequence signal at the first clock signal end CK1, CKV2 represents a timing sequence signal at the second clock signal end CK2, CKV3 represents a timing sequence signal at the third clock signal end CK3; V(NEXT) is a shifting signal and is substantially the same as a timing sequence signal V(POUT) at the first signal output end, V(NOUT) represents a timing sequence signal at the second signal output end NOUT; V(N1) represents a timing sequence signal at the first node N1, V(N2) and V(N2') both represent a timing sequence signal at the second node N2, V(N3) and V(N3') both represents a timing sequence signal at the third node N3, V(N4) and V(N4') both represents a timing sequence signal at the fourth node N4; taking the orientation in FIG. 17 and FIG. 18 as an example, V(N2) and V(N2') represent node timing sequence signals at the output end (e.g., right end) and the input end (e.g., left end) of the fifth transistor T5 respectively; V(N3) and V(N3') represent node timing sequence signals at the output end (e.g., right end) and the input end (e.g., left end) of the thirteenth transistor T13 respectively. The operating process of the shift register is detailed below.

In the first phase t01, the signal CKV1 inputted from the first clock signal end CK1 is a low-level signal, the signal V(IN) inputted from the shift register signal input end IN is a low-level signal, the signal CK2 inputted from the second clock signal end CK2 is a high-level signal; at this time, the first transistor T1 and the second transistor T2 turn on, the first node control module 110 transfers the low-level signal at the shift register signal input end IN to the second intermediate node N2' through the first transistor T1 and the second transistor T2, since the fifth transistor T5 is normally on, the low-level signal at the second intermediate node N2' is transferred to the second node N2; at this time, the gate electrode of the eighth transistor T8 is in an enable state, then the eighth transistor T8 turns on, the first output module 150 transfers the high-level signal at the second clock signal end CK2 to the first signal output end POUT through the eighth transistor T8.

At the same time, the gate electrode of the sixth transistor T6 is also in the enable state because of the low-level signal at the first clock signal end CK1, then the sixth transistor T6 turns on, the second node control module 120 transfers the low-level signal at the shift register signal input end IN to the first node N1 through the sixth transistor T6; at this time, the gate electrode of the ninth transistor is in the enable state, the ninth transistor T9 turns on, the first output module 150 transfers the high-level signal at the first power source signal input end V1 to the first signal output end POUT through the ninth transistor T9. In view of the above, the high-level signal is outputted at the first signal output end POUT.

Based on this, since the signals at the gate electrodes of the tenth transistor T10 and the eleventh transistor T11 are the high-level signal at the first signal output end POUT, the tenth transistor T10 and the eleventh transistor T11 are in a cut-off state.

In this phase, the third clock signal end CK3 has a low-level signal, the twelfth transistor T12 turns on, the third node control module 130 transfers the low-level signal at the second power source signal input end V2 to a third intermediate node N3' through the twelfth transistor T12, since the third transistor T13 is normally on, the low-level signal at the third intermediate node N3' is transferred to the third node N3, thus the third node N3 is at the low level; at this time, the seventeenth transistor T17 turns on, the second output module 160 transfers the low-level signal at the second power source signal input end V2 to the second signal output end NOUT through the seventeenth transistor T17.

At the same time, since the third intermediate node N3' is at the low level, the fifteenth transistor T15 turns on, the fourth node control module 140 transfers the high-level signal at the first power source signal input end V1 to the fourth node N14 through the fifteenth transistor T15; at this time, the gate electrode of the sixteenth transistor T16 has a high-level signal, the sixteenth transistor T16 is cut off, such that the second output module 160 does not transfer the high-level signal at the first power source signal input end V1. In view of the above, the low-level signal is outputted at the second signal output end NOUT.

In this way, in the first phase t01, the high-level signal is outputted from the first signal output end POUT, the low-level signal is outputted from the second signal output end NOUT.

In the second phase t02, the signal CKV1 inputted from the first clock signal end CK1 is a high-level signal, the signal V(IN) inputted from the shift register signal input end IN is a high-level signal, the signal CKV2 inputted from the second clock signal end CK2 is a low-level signal; at this time, the first transistor T1, the second transistor T2 and the sixth transistor T6 is cut off, the first node control module 110 stops transferring the low-level signal to the second node N2, however because of the function of potential holding of the second capacitor C2, the second intermediate node N2' is still held at the low level and the second node N2 is held at the low level; at this time, the gate electrode of the seventh transistor T7 is in the enable state, the second node control module 120 transfers the high-level signal at the shift register signal input end IN to the first node N1 through the seventh transistor T7; the first node N1 turns to the high level, the ninth transistor T9 is cut off; at the same time, the potential at the gate electrode of the eighth transistor T8 is held at the low level at the second node N2, the eighth transistor T8 turns on, thus the first output module 150 transfers the low-level signal at the second clock signal end CK2 to the first signal output end POUT. Based on this, since the second node N2 is suspended, in consideration of the coupling function of the second capacitor C2, when the first signal input end POUT jumps from the high level to the low level, a charge coupling quantity is generated and is also coupled to the second node N2, which further lower the potential at the second node N2 from the low level in the first phase; therefore the transferring channel, i.e., the eighth transistor T8, in the first output module 150 and under the control of the second node N2, i.e., the second gamma control end ctr52, completely turns on, so that the low level at the second clock signal end CK2 is completely transferred to the first signal output end POUT.

Based on this, the potential at the gate electrodes of the tenth transistor T10 and the eleventh transistor T11 is the low level, the tenth transistor T10 and the eleventh transistor T11 turn on, the third node control module 130 transfers the high-level signal at the first power source signal input end V1 to the third node N3 through the tenth transistor T10 and the eleventh transistor T11; then the potential at the third node N3 and the third intermediate node N3' increases, thus the potential at the gate electrode at the seventeenth transistor T17 is the high level, the seventeenth transistor T17 is cut off, i.e., blocked.

At the same time, the first signal output end POUT is at the low level, i.e., the potential at the gate electrode of the fourteenth transistor T14 is the low level, the fourteenth transistor T14 turns on, the fourth node control module 140 transfers the low-level signal at the second power source signal input end V2 to the fourth node N4 through the fourteenth transistor T14; at this time, the gate electrode of the sixteenth transistor T16 is in the enable state, the sixteenth transistor T16 turns on, the second output module 160 transfers the high-level signal at the first power source signal input end V1 to the second signal output end NOUT through the sixteenth transistor T16.

In this way, in the second phase t02, the low-level signal is outputted from the first signal output end POUT, the high-level signal is outputted from the second signal output end NOUT.

In the third phase t03, the signal CKV1 inputted from the first clock signal end CK1 is a low-level signal, the signal V(IN) inputted from the shift register signal input end IN is a high-level signal; at this time, the first transistor T1 and the second transistor T2 turn on, the first node control module 110 transfers the high-level signal at the shift register signal input end IN to the second node N2 through the first transistor T1 and the second transistor T2; at this time, the gate electrodes of the seventh transistor T7 and the eighth transistor T8 are both in a disable state, i.e., the seventh transistor T7 and the eighth transistor T8 are both cut off; the gate electrode of the first transistor T1 is in the enable state, the first transistor T1 turns on, the second node control module 120 transfers the low-level signal at the second power source signal input end V2 to the first node N1 through the first transistor T1; at this time, the potential at the gate electrode of the ninth transistor T9 is the low level, the ninth transistor T9 turns on, the first output module 150 transfers the high-level signal at the first power source signal input end V1 to the first signal output end POUT through the ninth transistor T9.

Based on this, the gate electrodes of the tenth transistor T10 and the eleventh transistor T11 are in the disable state, the tenth transistor T10 and the eleventh transistor T11 are cut off.

At the same time, the signal CKV3 inputted from the third clock signal end CK3 is a low-level signal, the gate electrode of the twelfth transistor T12 is in a low-level state, the twelfth transistor T12 turns on, the third node control module 130 transfers the low-level signal at the second power source signal input end V2 to the third node N3 through the twelfth transistor T12; then the gate electrodes of the fifteenth transistor T15 and the seventeenth transistor T17 are both in the enable state, the fourth node control module 140 transfers the high-level signal at the first power source signal input end V1 to the fourth node N4 through the fifteenth transistor T15, so that the potential at the gate electrode of the sixteenth transistor T16 is the high level, the sixteenth transistor T16 is cut off, and the second output module 160 transfers the low-level signal at the second power source signal input end V2 to the second signal output end NOUT through the seventeenth transistor T17.

In combination with the information of the potential at the second signal output end NOUT in the second phase, and based on the second phase, when the signal outputted from the second signal output end NOUT jumps from the high level to the low level, a charge coupling quantity is generated and is coupled to the other end of the third capacitor C3, i.e., the third node N3, through the coupling function of the coupling module 180, so as to further lower the potential at the third node N3 from the potential in the second phase, i.e., further lower from the low level at the gate electrode of the seventeenth transistor T17; thus, the seventeenth transistor T17 in the second output module 160 is completely turned on, i.e., the signal transferring channel formed of the seventeenth transistor T17 completely turns on, such that the low level at the second power source signal input end V2 is completely transferred to the second signal output end NOUT without potential loss.

In this way, in the third phase t03, the high-level signal is outputted from the first signal output end POUT, the low-level signal is outputted from the second signal output end NOUT.

In the fourth phase t04, the signal CKV1 inputted from the first clock signal end CK1 is a high-level signal, the signal V(IN) inputted from the shift register signal input end IN is a high-level signal; at this time, the gate electrodes of the first transistor T1, the second transistor T2 and the sixth transistor T6 are in the disable state, the first transistor T1, the second transistor T2 and the sixth transistor T6 are all cut off, the second node control module 120 cannot transfers the low-level signal at the second power source signal input end V2; at this time, because of the function of potential holding of the storage module 170, the first node N1 may be held at the low level; then the gate electrode of the fourth transistor T4 is at the low level, the fourth transistor T4 turns on, and at the same time, the potential at the gate electrode of the third transistor T3, i.e., the signal CKV2 inputted from the second clock signal end CK2, is also the low-level signal, thus the third transistor T3 turns on; in this view, the first node control module 110 transfers the high-level signal at the first power source signal input end V1 to the second node N2 through the fourth transistor T4 and the third transistor T3, the second node N2 turns to the high level; at this time, the potential at the gate electrode of the eighth transistor T8 is the high level, the eighth transistor T8 is cut off.

At the same time, since the first node N1 is held at the low level, the gate electrode of the ninth transistor T9 is in the enable state, the ninth transistor T9 turns on, the first output module 150 transfers the high-level signal at the first power source signal input end V1 to the first signal output end POUT through the ninth transistor T9.

At the same time, the potential at the third node N3 is held at the low-level state by the coupling module 180, the low-level signal at the second power source signal input end V2 is continuously outputted via the second signal output end NOUT.

In addition, since the third node N3 is at the low level, the fifteenth transistor T15 turns on, the fourth node control module 140 transfers the high-level signal at the first power source signal input end V1 to the fourth node N4 through the fifteenth transistor T15, such that the gate electrode of the sixteenth transistor T16 is in the disable state, the sixteenth transistor T16 is cut off. Since the thirteenth transistor T13 is normally on, in this phase, the potential at the third node N3 is not affected by the leakage current at the third intermediate node N3'. Exemplarily, if the tenth transistor T10, the eleventh transistor T12 and the twelfth transistor T12 have leakage currents, the potential at the third intermediate node N3' increases; because of the blocking function of the thirteenth transistor T13, the increased amount of the potential at the third node N3 will finally have a difference of the threshold voltage of the transistor with the third intermediate node N3', so as to ensure that the on-state of the seventeenth transistor T17 is not affected, and that the potential outputted from the second signal output end NOUT is not affected.

In this way, in the fourth phase t04, the high-level signal is outputted from the first signal output end POUT, the low-level signal is outputted from the second signal output end NOUT.

The operating state in the fifth phase t05 is the same as the operating state in the third phase. In this way, in the fifth phase t05, the high-level signal is outputted from the first signal output end POUT, the low-level signal is outputted from the second signal output end NOUT.

Thus, the shift register can implement shifting of positive and negative levels while avoiding step-down. The potential values at input ends, output ends and nodes in different phases are described below with reference to Table 1.

TABLE 1

Table of variance in potential values at respective nodes
in the operating process of the shift register

|         | t001       | t002       | t003       | t004       | t005       |
|---------|------------|------------|------------|------------|------------|
| V(IN)   | −7.00000   | 8.00000    | 8.00000    | 8.00000    | 8.00000    |
| CKV1    | −7.00000   | 8.00000    | −7.00000   | 8.00000    | −7.00000   |
| CKV2    | 8.00000    | −7.00000   | 8.00000    | −7.00000   | 8.00000    |
| CKV3    | −7.00000   | 8.00000    | −7.00000   | 8.00000    | −7.00000   |
| V(N1)   | −5.72955   | 7.99998    | −4.81615   | −4.82210   | −4.92446   |
| V(N2)   | −4.58579   | −18.37951  | 7.99995    | 7.99999    | 7.99991    |
| V(N2')  | −4.65056   | −5.40928   | 7.99912    | 7.99911    | 7.99909    |
| V(N4)   | 8.00000    | −4.62470   | 7.99999    | 7.99999    | 8.00000    |
| V(N3)   | −11.84798  | 8.00029    | −11.91270  | −11.89584  | −11.89411  |
| V(N3')  | −6.45976   | 8.00005    | −5.22803   | −5.22797   | −5.77603   |
| V(NOUT) | −7.00000   | 7.99988    | −7.00000   | −7.00000   | −7.00000   |
| V(POUT) | 8.00017    | −7.00112   | 8.00052    | 7.99998    | 7.99999    |

The potential values are in units of volt (V). Corresponding to the time nodes as shown in FIG. 20, Table 1 shows potential values at respective nodes during the operating process of the shift register, thus it can be seen that the output of the shift register has no step-down and can implement shifting of positive and negative levels.

In other embodiments, the potential values at the input ends may be set according to actual requirements on the shift register, the potential values at nodes and output ends vary accordingly, which will not be detailed or limited in the present disclosure.

Based on the embodiments described above, the present disclosure further provides a gate driving circuit, the gate driving circuit includes a plurality of any shift register provided in above embodiments arranged in cascade; therefore, the gate driving circuit has the same beneficial effects as the shift register in above embodiments, the same part can be understood with the above explanation and description of the shift register and will not be detailed below.

The structure and driving timing sequence of the gate driving circuit are exemplarily described below in conjunction with FIG. 21 to FIG. 25.

Figure 21:
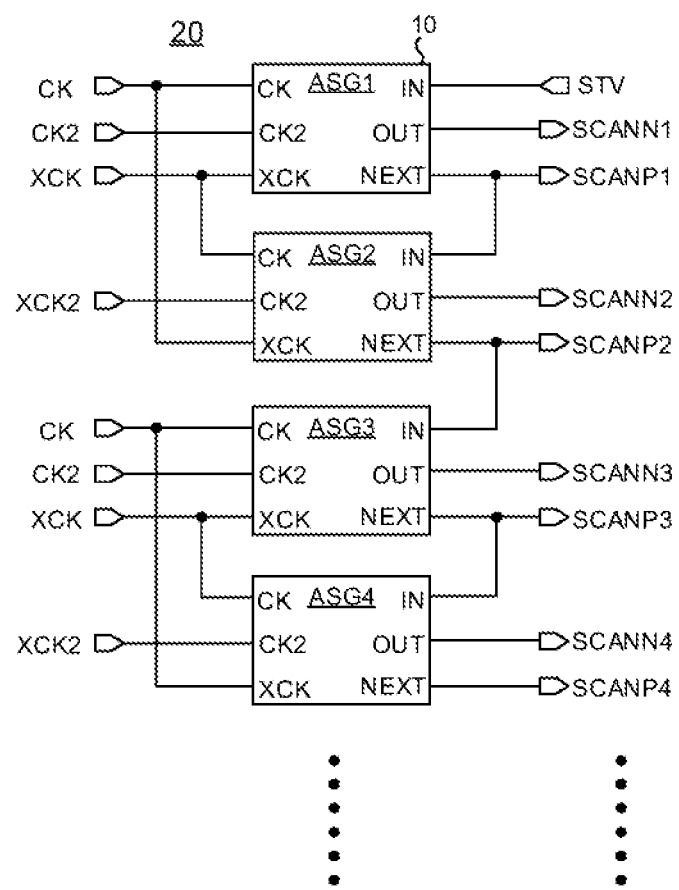
FIG. 21 is a block diagram of a gate driving circuit according to an embodiment of the present disclosure.

Exemplarily, referring to FIG. 21, the gate driving circuit 20 includes shift registers 10 arranged in cascade; FIG. 21 exemplarily shows shift registers 10 in four stages, i.e., a first-stage shift register ASG1, a second-stage shift register ASG2, a third-stage shift register ASG3 and a fourth-stage shift register ASG4; where the shift register signal input end IN of the first-stage shift register ASG1 is electrically connected to an initial signal input end STV, the first signal output end NEXT (i.e., the end POUT in previous description) of an i-th-stage shift register 10 is electrically connected to the shift register signal input end IN of an (i+1)-th-stage shift register 10, where i is a positive integer.

The operating process inside the shift register in each stage may be understood with reference to the above description and will not be detailed here. Based on this, the first-stage shift register ASG1 is triggered by a signal inputted from the initial signal input end STV and starts to work, and outputs an enable level signal in the second phase; when the first signal output end NEXT of the i-th-stage shift register outputs a first enable level (i.e., low level), the shift register signal input end IN of the (i+1)-th-stage shift register has this first enable level inputted and is triggered to work; at the same time, the second signal output end OUT of the i-th-stage shift register 10 outputs a second enable level (i.e., high level).

It can be understood that i is a positive integer. The first signal output end and the second signal output end of the i-th-stage shift register are denoted as SCANPi and SCANNi, for example, SCANP1, SCANN1, SCANP2, SCANN2, SCANP3, SCANN3, SCANP4, SCANN4 and the like.

Exemplarily, the first-stage shift register ASG1 is triggered by the signal inputted from the initial signal input end STV, and in the second phase, the first signal output end outputs the low level, the second signal output end outputs the high level; the low level outputted from the first signal output end triggers the second-stage shift register ASG2 and the second-stage shift register ASG2 starts to work; at the same time, since the third phase starts, the first-stage shift register ASG1 keeps to output the high level at the first signal output end and output the low level at the second signal output end, so as to implement sequentially output of high and low levels by the shift registers connected in cascade.

Two different operating timing sequences are exemplarily described below in conjunction with FIG. 22 to FIG. 25.

Figure 22:
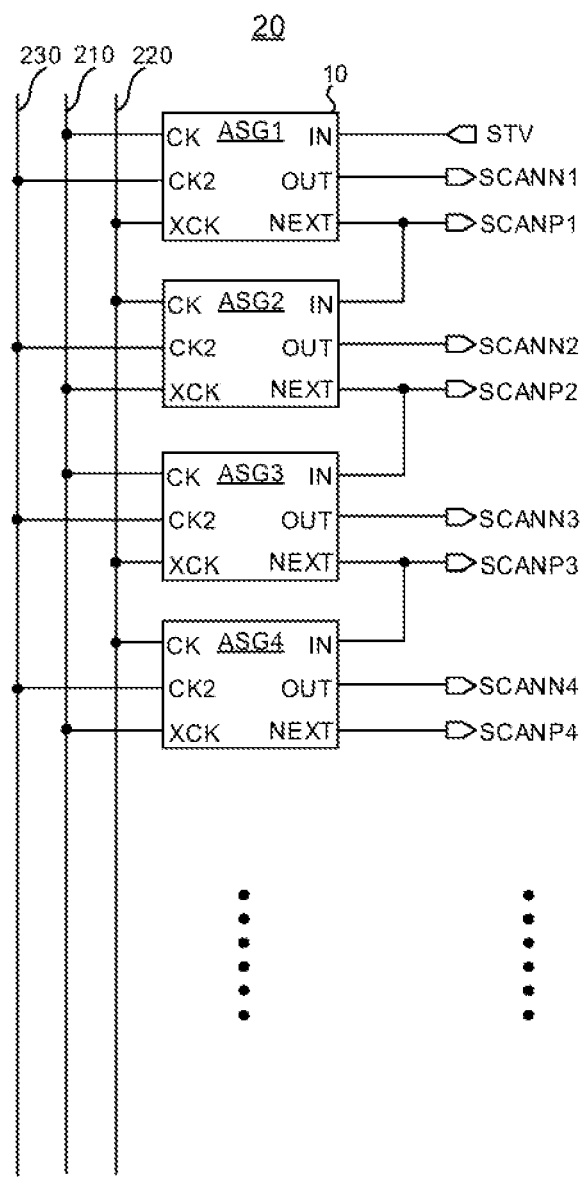
FIG. 22 is a block diagram of another gate driving circuit according to an embodiment of the present disclosure.
Figure 23:
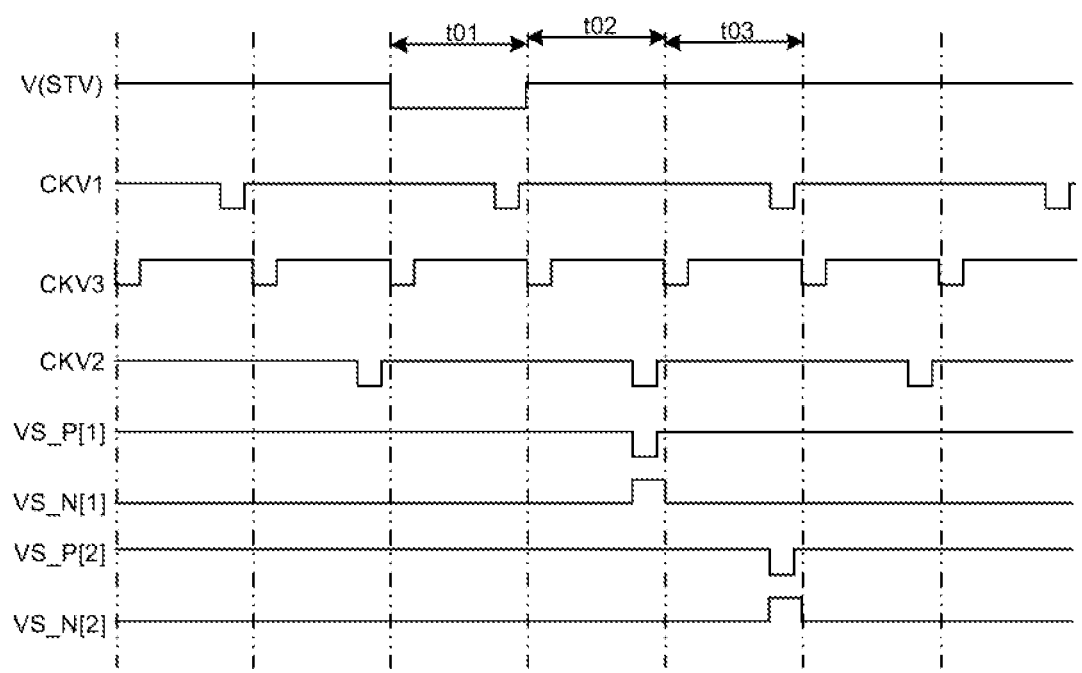
FIG. 23 illustrates a driving timing sequence of a gate driving circuit according to an embodiment of the present disclosure.

In an embodiment, referring to FIG. 22 and FIG. 23, the gate driving circuit 20 further includes a first clock signal line 210, a second clock signal line 220 and a third clock signal line 230; first clock signal ends CK of shift registers 10 in odd-numbered stages and second clock signal ends XCK of shift registers 10 in even-numbered stages are electrically to the first clock signal line 210, second clock ends XCK of shift registers 10 in odd-numbered stages and first clock signal ends CK of shift registers 10 in even-numbered stages are electrically connected to the second clock signal line 220, third clock signal ends XCK of shift registers 10 in all stages are electrically connected to the third clock signal line 230; the first clock signal line 210 is configured to provides a first clock signal CKV1, the second clock signal line 220 is used to provide a second clock signal CKV2, the third clock signal line 230 is used to provide a third clock signal CKV3; the period of the first clock signal CKV1 and the period of the period of the second clock signal CKV2, are equal and are double of the period of the third clock signal CKV3.

Such configuration can reduce the number of wires in the gate driving circuit 20, which facilitates wiring design, and is beneficial to reduction of the overall volume of the gate driving circuit 20 and thus the area occupied by the gate driving circuit 20 on the frame, thereby implementing narrow bezel design of a display panel and a display device.

The third clock signal line 230 is connected not only to the third clock signal ends CK2 of the shift registers 10 in the odd-numbered stages, but also to the third clock signal ends CK2 of the shift registers 10 in the even-numbered stages, the third clock signal line 230 therefore provides the third clock signal CKV3 to the shift registers in all stages. Since the period of the third clock signal CKV3 is set to be half of the period of the first clock signal CKV1 and the second clock signal CKV2, the clock requirements of the third clock signal end CK2 of the shift registers 10 in all stages can be satisfied.

Exemplarily, the operating process of the gate driving circuit 20 is described by taking the first-stage shift register ASG1 and the second-stage shift register ASG2 as an example.

In FIG. 23, V(STV) is an initial trigger signal; VS_P[1], VS_N[1], VS_P[2] and VS_N[2] are signals at the first signal output end of the first-stage shift register, the second signal output end of the first-stage shift register, the first output end of the second-stage shift register and the second output end of the second-stage shift register, respectively.

For the first-stage shift register, in the first phase t01, the first signal output end outputs the high-level signal, the second signal output end outputs the low-level signal; in the second phase t02, the first signal output end outputs the low-level signal, the second signal output end outputs the high-level signal; in the third phase t03, the fourth phase t04 and the fifth phase t05, the first signal output end continuously outputs the high-level signal, the second signal output end continuously outputs the low-level signal.

For the second-stage shift register, in the second phase t02 of the first-stage shift register, the low-level signal outputted from the first signal output end of the first-stage shift register is used as the trigger signal for the second-stage shift register, i.e., the second-stage shift register takes this as the first phase t01 and starts to work, and repeats the operating process of the first-stage shift register described above.

Figure 24:
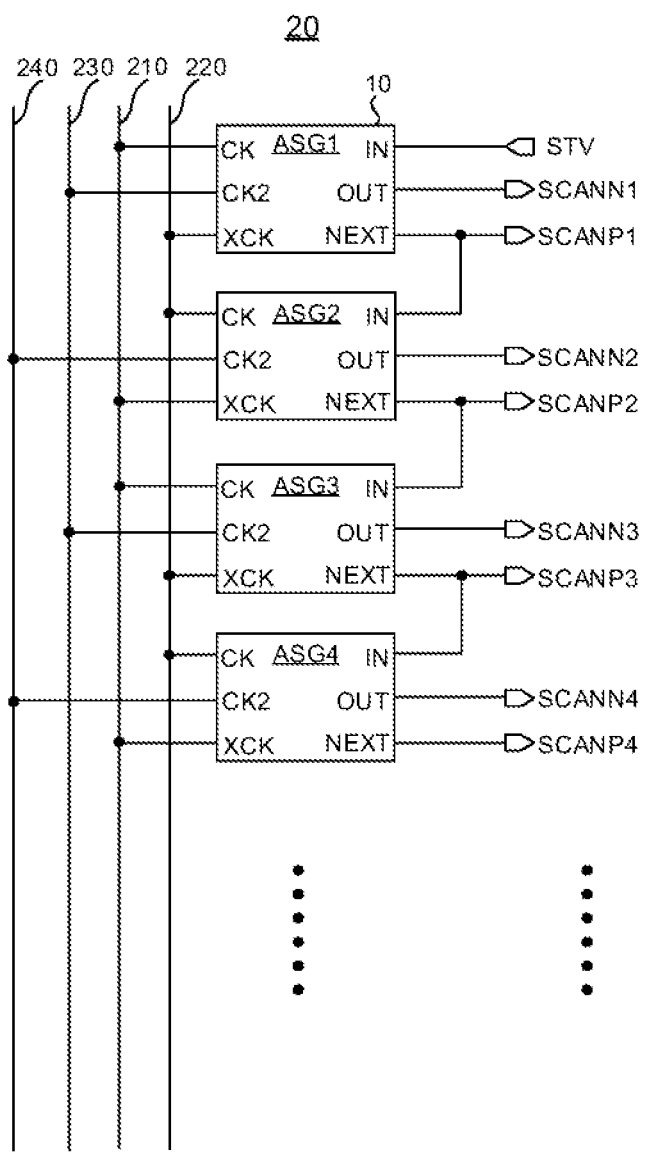
FIG. 24 is a block diagram of yet another gate driving circuit according to an embodiment of the present disclosure.
Figure 25:
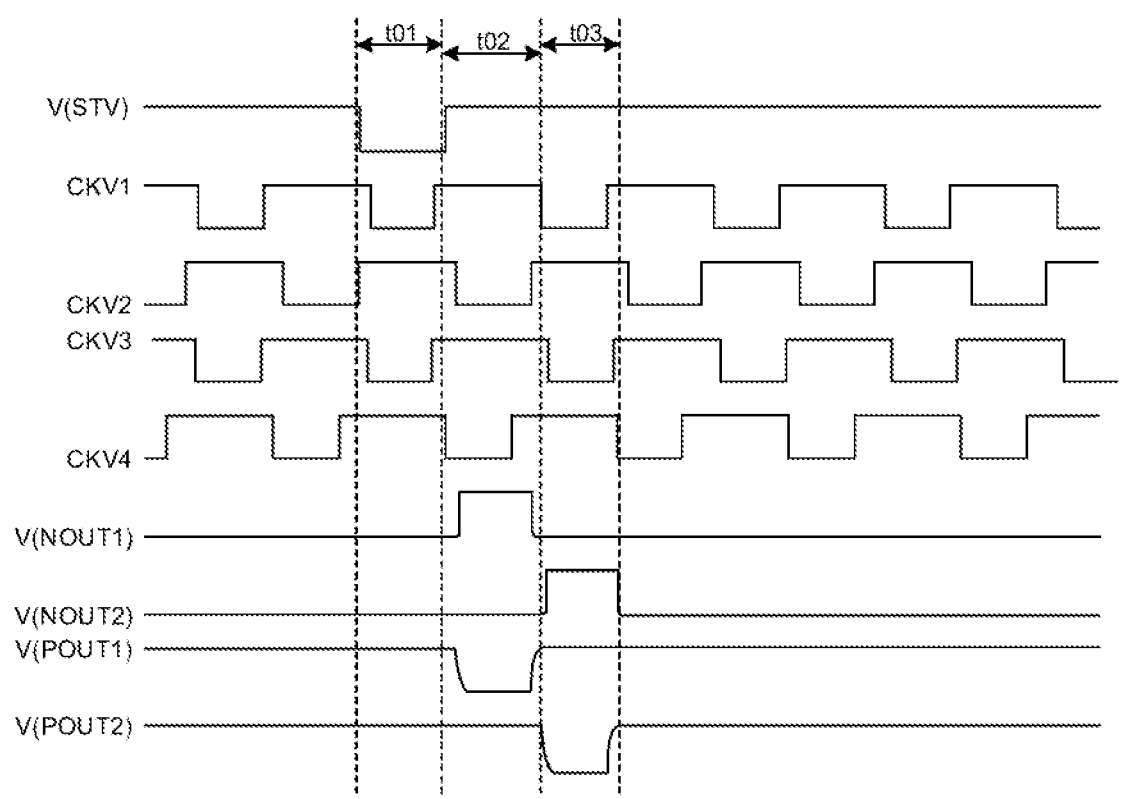
FIG. 25 illustrates a driving timing sequence of another gate driving circuit according to an embodiment of the present disclosure.

In an embodiment, referring to FIG. 24 and FIG. 25, the gate driving circuit 20 further includes a first clock signal line 210, a second clock signal line 220, a third clock signal line 230 and a fourth clock signal line 240; first clock signal ends CK of shift registers 10 in odd-numbered stages and second clock signal ends XCK of shift registers 10 in even-numbered stages are electrically to the first clock signal line 210, second clock ends XCK of shift registers 10 in odd-numbered stages and first clock signal ends CK of shift registers 10 in even-numbered stages are electrically connected to the second clock signal line 220, third clock signal ends CK2 of shift registers 10 in the odd-numbered stages are electrically connected to the third clock signal line 230, third clock signal ends CK2 of shift registers 10 in even-numbered stages are electrically connected to the fourth clock signal line 240; the first clock signal line 210 is configured to provides a first clock signal CKV1, the second clock signal line 220 is used to provide a second clock signal CKV2, the third clock signal line 230 is used to provide a third clock signal CKV3, the fourth clock signal line 240 is used to provide a fourth clock signal CKV4; the period of the first clock signal CKV1, the period of the period of the second clock signal CKV2, the period of the third clock signal CKV3 and the period of the fourth clock signal CKV4 are equal to each other.

With such configuration, the periods of the first clock signal CKV1, the second clock signal CKV2, the third clock signal CKV3 and the fourth clock signal CKV4 are maintained to be equal, such that these clock signal may be provided in similar manners with merely different effective start time, thereby obtaining a simple driving timing sequence of the gate driving circuit 20 and simple front-end structure or front-algorithm of the clock signals.

Exemplarily, FIG. 25 shows an driving timing sequence which drives the gate driving circuit 20 to operate according to the operating process similar to the above operating process, which can be understood with reference to the previous description and will not be detailed.

It should be noted that the difference between the driving timing sequence in FIG. 23 and the driving timing sequence in FIG. 25 is that, FIG. 23 shows three clock signals, while FIG. 25 shows four clock signals; the third clock signal CKV3 in FIG. 23 may be regarded as the driving signal obtained from superposition of the third clock signal CKV3 and the fourth clock signal CKV4 in FIG. 24, therefore the third clock signal CKV3 in FIG. 23 has a halved period. Based on this, one clock signal line is reduced, which is beneficial to implementation of narrow bezel.

It should be noted that, for the clock signals in FIG. 23 and FIG. 25, the enable duration and the interval duration of a clock signal may be different. In other embodiments, the length of the enable duration and the length of the interval duration of each clock signal may be set according to actual requirements of the gate driving circuit, and is not limited in the present disclosure.

Based on the embodiments described above, the present disclosure further provides a display panel, the display panel includes any gate driving circuit provided in above embodiments, thus the display panel also has the beneficial effects of the gate driving circuit and the shift register in the gate driving circuit provided in above embodiments, the same part can be understood with the above explanation and description of the shift register and the gate driving circuit, and will not be detailed below.

The display panel and its pixel driving circuit provided in the present disclosure are exemplarily described below in conjunction with FIG. 26 to FIG. 30.

Figure 29:
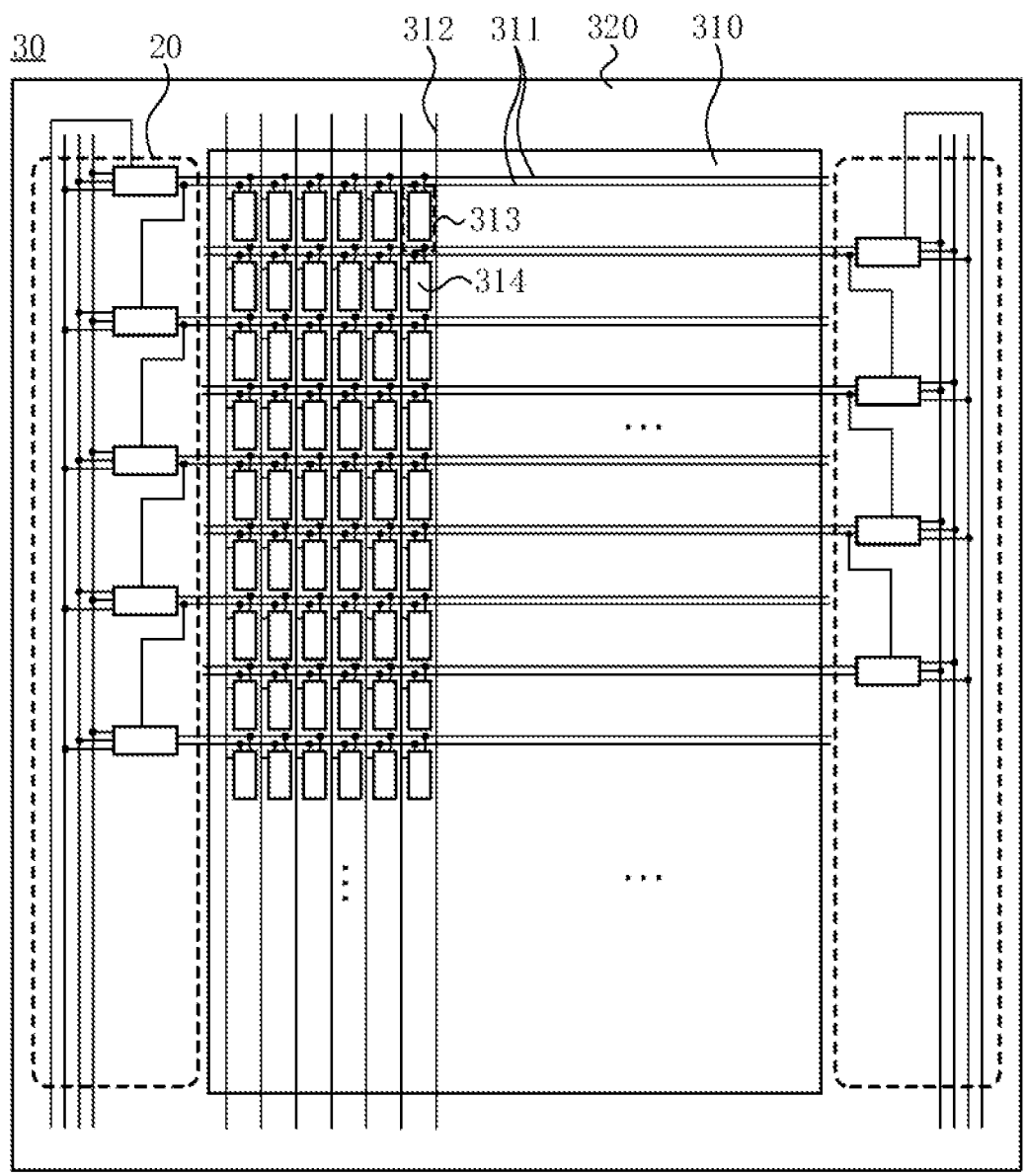
FIG. 29 is a block diagram of another display panel according to an embodiment of the present disclosure.
Figure 30:
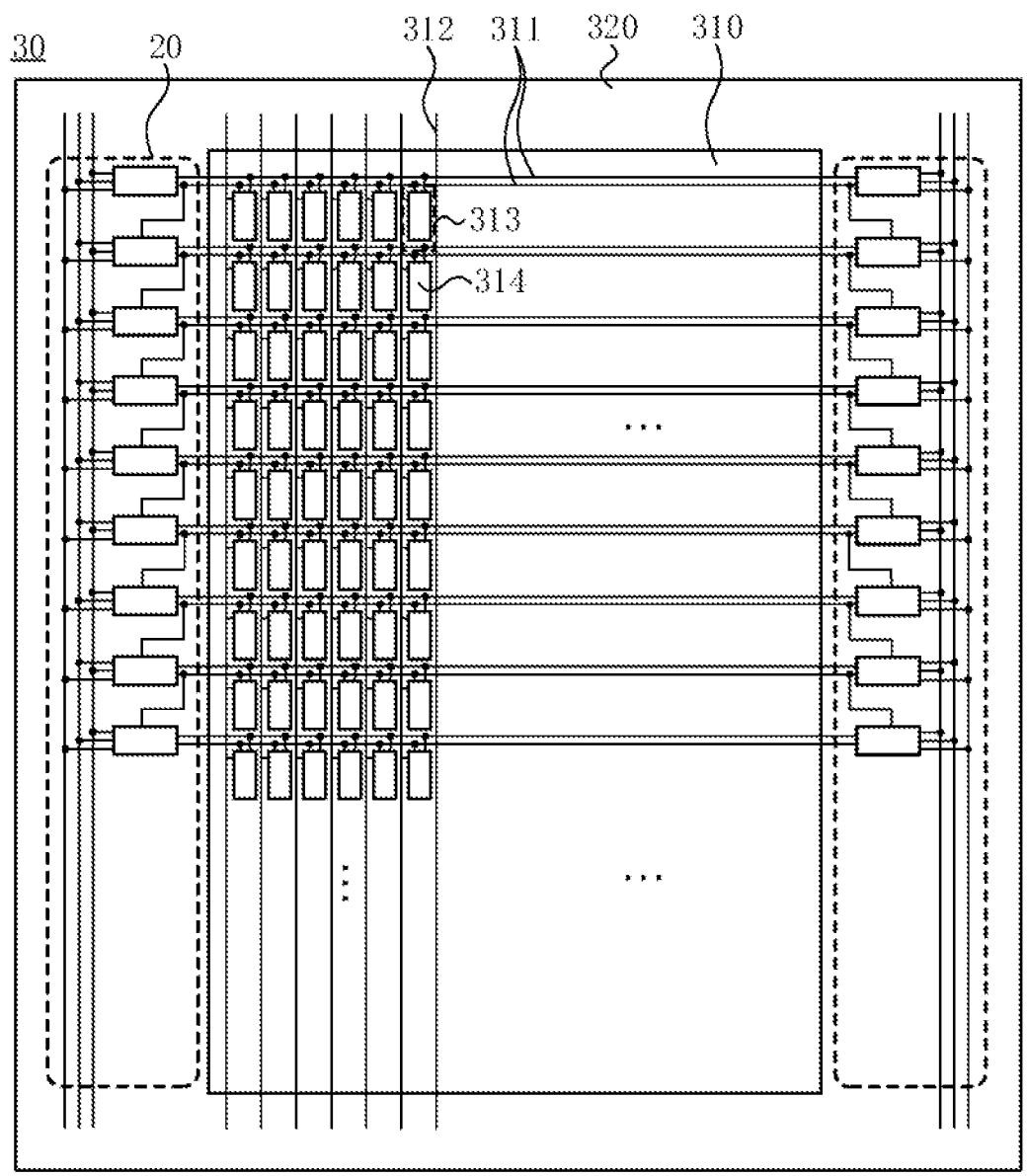
FIG. 30 is a block diagram of yet another display panel according to an embodiment of the present disclosure.

Exemplarily, referring to FIG. 2, FIG. 29 or FIG. 30, the display panel 30 includes a display region 310 and a non-display region 320 surrounding the display region 310, the non-display regions 320 is provided with a gate driving circuit 20; the display region 310 is provided with scanning lines 311 and data lines 312, the scanning lines 311 and the data lines 312 intersect to define multiple sub-pixel regions 313, each sub-pixel region 313 is provided with one pixel circuit 314.

The display region 310 of the display panel 30 is used to display a to-be-displayed image.

Exemplarily, the display panel 30 may be a display panel of an organic light-emitting diode (OLED) or other types known to the skilled person in the art, which is not limited in the present disclosure.

The non-display region 320 of the display panel 30 may also include an anti-static circuit, an integrated circuit and other circuit structures known to the skilled person in the art, which is not limited in the present disclosure.

Figure 26:
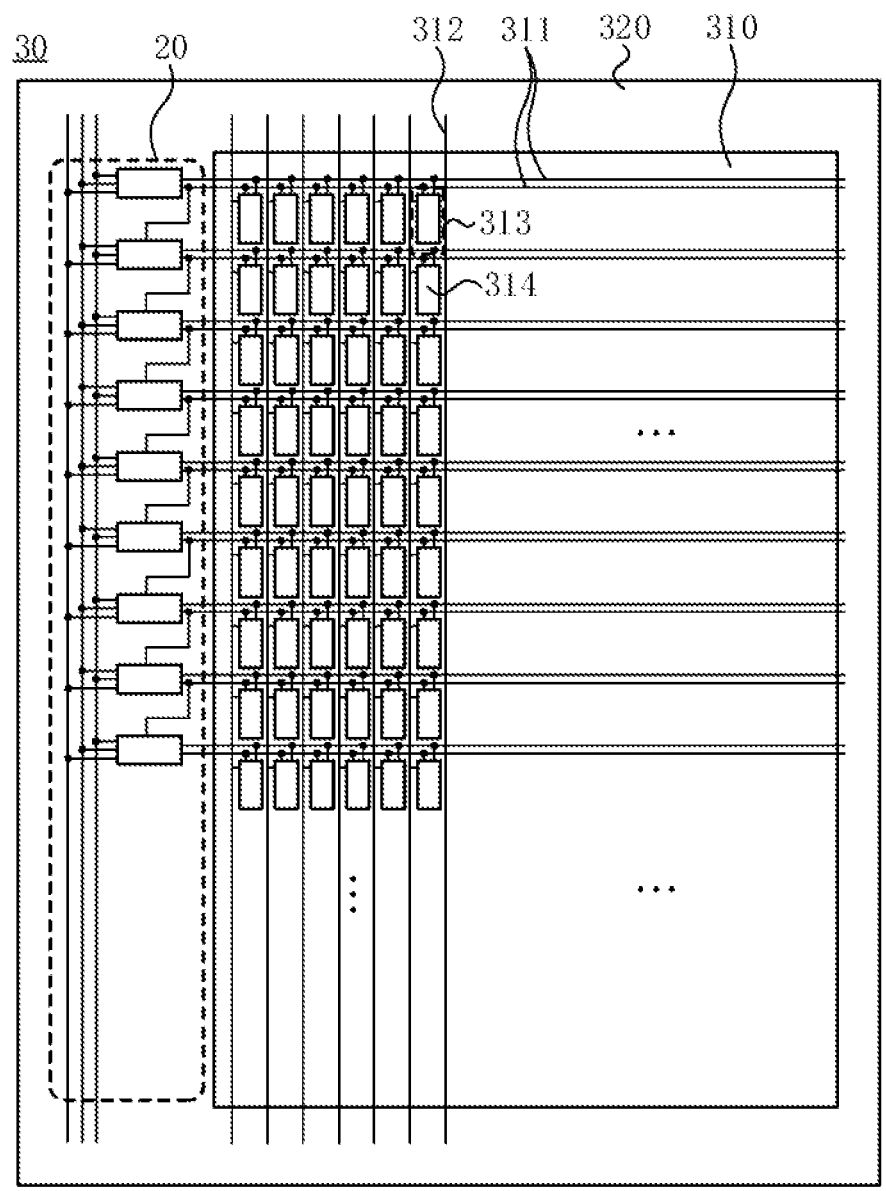
FIG. 26 is a structural diagram of a display panel according to an embodiment of the present disclosure.

Exemplarily, FIG. 26, FIG. 29 and FIG. 30 merely exemplarily shows an arrangement in which the display region 310 is surrounded by the non-display region 320. In other embodiments, the non-display region 320 may also be arranged to half surround the display region 310, or the non-display region 320 may be arranged at both sides of the display region 310, or the non-display region 320 and the display region 310 may be arranged with other relative position relationship known to the skilled person in the art, which is not limited in the present disclosure.

The scanning lines 311 and the data lines 312 may perpendicularly intersect, or may non-perpendicularly intersect, which is not limited in the present disclosure.

It should be noted that FIG. 26, FIG. 29 and FIG. 30 merely exemplarily show scanning lines 311 and data lines 312 in the form of linear lines. In the actual product structure of the display panel 30, the actual form of the scanning lines 311 and data lines 312 may be configured according to actual requirements of the display panel 30, which is not limited in the present disclosure.

Exemplarily, FIG. 26, FIG. 29 and FIG. 30 merely exemplarily show sub-pixel regions 313 in the form of rectangle. In the actual product structure of the display panel 30, the shape of the sub-pixel regions 313 may be configured according to the wiring manner and other requirements of the display panel 30, which is not limited in the present disclosure.

It should be noted that FIG. 26, FIG. 29 and FIG. 30 merely exemplarily show scanning lines 311 and data lines 312 both extending from the display region 310 to the non-display region 320. In other embodiments, the length of the scanning lines 311 and the data lines 312, as well as the relative position relationship of the scanning lines 311 and the data lines 312 with the border of the display region 310, may also be configured according to actual requirements of the display panel 30, which is not detailed in the present disclosure.

It can be understood that, in FIG. 26, FIG. 29 and FIG. 30, the circuit component structure of the pixel circuit 314, e.g., 7T1C circuit or other circuit structures known to the skilled person in the art, may include transistors (T) and capacitors (C), which is not limited in the present disclosure.

Figure 27:
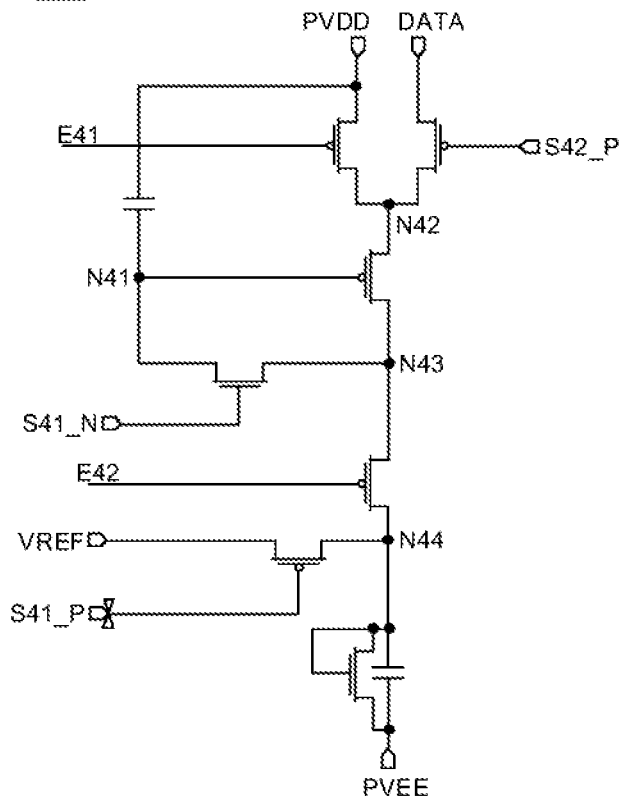
FIG. 27 is a circuit diagram of a pixel driving circuit of the display panel of FIG. 26.
Figure 28:
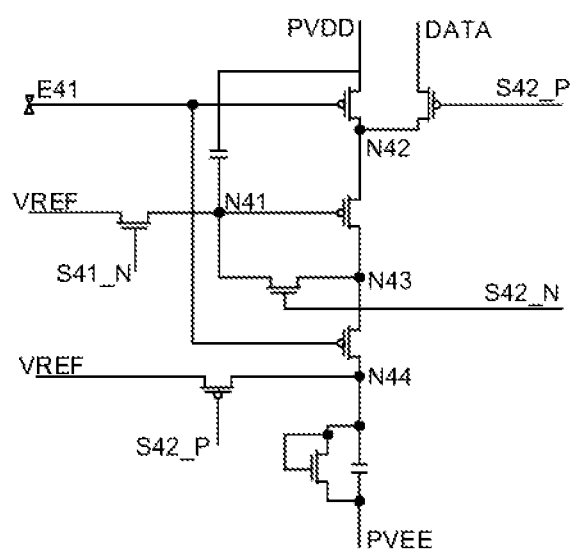
FIG. 28 is a circuit diagram of another pixel driving circuit of the display panel of FIG. 26.

In the structure of the above display panel 30, in combination with FIG. 27 or FIG. 28, one pixel circuit 314 includes at least one N-type transistor and at least one P-type transistor; for the pixel circuits 314 in each row, control ends of N-type transistors are electrically connected to a second signal output end of a shift register in one stage via a scanning line 311, control ends of P-type transistors are electrically connected to a first signal output end of the shift register in this stage via another scanning line 311.

The N-type transistor is a high-level enable transistor and is driven by a signal outputted from the second signal output end of the shift register in the gate driving circuit; the P-type transistor is a low-level enable transistor and is driven by a signal outputted from the first signal output end of the shift register in the gate driving circuit.

Exemplarily, FIG. 27 and FIG. 28 show two pixel driving circuits having different circuit component structures, where N41, N42, N43 and N44 represent respective potential nodes; PVDD, PVEE and DATA represent a high-level signal end, a low-level signal end and a data signal end respectively; E41 represents a light-emitting control signal end; VREF represents a reference potential signal end; S41_N, S41_P, S42_N and S42_P represent four different scanning signal ends respectively, S41_N and S42_N representing high-level enable scanning signal ends, S41_P and S42_P representing low-level enable scanning signal ends.

When the pixel driving circuit 314 shown in FIG. 27 and FIG. 28 operates, in a threshold acquisition duration of the pixel driving circuit 314, the data signal inputted from the data signal end DATA passes through the potential nodes N42 and N43 and then is written into N41; then in the light-emitting phase, the potential difference between the high-level signal end PVDD and the potential node N41 determines a driving current flowing through the light-emitting element.

Exemplarily, in FIG. 27, the transistor which affects the potential holding effect at the potential node N41 is an N-type transistor driven by the high-level enable scanning signal end S41_N; in FIG. 28, the transistor which affects the potential holding effect at the potential node N41 includes an N-type transistor driven by the high-level enable scanning signal end S41_N and an N-type transistor driven by the high-level enable scanning signal end S42_N. The shift register is explained and described in combination with the above. The shift register provided in the present disclosure can implement positive potential shifting, i.e., there is no step-down in the high-to-low conversion of the driving signal outputted from the second signal output end of the shift register, therefore this driving signal is inputted to the high-level enable scanning signal end S42_N, so as to ensure complete turn-off of the N-type transistor in the cut-off state under the control of the driving signal, thereby avoiding leakage current and ensuring good display effect.

It should be noted that, FIG. 27 and FIG. 28 merely exemplarily show circuit component structures of two pixel driving circuits 314. In other embodiments, the pixel driving circuit 314 may also use other circuit component structures including a P-type transistor and an N-type transistor known to the skilled person in the art, and may be configured according to actual requirements of the pixel driving circuit 314 and the display panel 30, which is not limited in the present disclosure.

Hereafter, the arrangement manner of the gate driving circuits 20 in the display panel 30 and the driving scanning manner of the display panel 30 are exemplarily described below in conjunction with FIG. 26, FIG. 29 and FIG. 30.

In an embodiment, with continuing reference to FIG. 26, the display panel 30 includes a gate driving circuit 20; each shift register in the gate driving circuit 20 is connected to a scanning line 311 corresponding to a respective row of pixel circuits 314 in the display panel. This arrangement can at the same time ensure normal display of an image on the display panel 30 and implement a simple structure of the display panel 30.

In an embodiment, with continuing reference to FIG. 29 and FIG. 30, the display panel 30 includes two gate driving circuits 20; two gate driving circuits 20 are arranged in the non-display region 320 at opposite sides of the display region 310.

Therefore, bilateral driving scanning can be achieved.

Exemplarily, with continuing reference to FIG. 29, one gate driving circuit 20 is connected to scanning lines 311 corresponding to pixel circuits 314 in odd-numbered rows in the display panel 30, the other gate driving circuit 20 is connected to scanning lines 311 corresponding to pixels circuits 314 in even-numbered stages in the display panel 30.

Therefore, bilateral single-driving scanning can be achieved. At the same time, the arrangement manner of the gate driving circuit 20 can reduce the number of shift registers in a display region 320 at each side, which is beneficial to reduction of the area of the non-display region 320 occupied by the gate driving circuit 20, and thus beneficial to implementation of the narrow bezel design of the display panel 30.

Exemplarily, with continuing reference to FIG. 30, the shift registers in two gate driving circuits 20 are arranged in one-to-one correspondence, two ends of each scanning line 311 in the display panel 30 are respectively connected to shift registers, which are oppositely arranged, of these two gate driving circuits 20.

Therefore, bilateral dual-driving scanning can be achieved. Based on this, the relative uniform signal on a same scanning line 311 is beneficial to improvement of the image display effect of the display panel 30.

Based on the above embodiments, the present disclosure further provides a display device, the display device includes any display panel provided in the above embodiments. Exemplarily, referring to FIG. 31, the display device 50 includes the display panel 30. Therefore, the display device also has the beneficial effect of the display panel, the gate driving circuit and the shift register in the above embodiments, the same part can be understood with the above explanation and description of the display panel, the gate driving circuit and the shift register and will not be detailed below.

Figure 31:
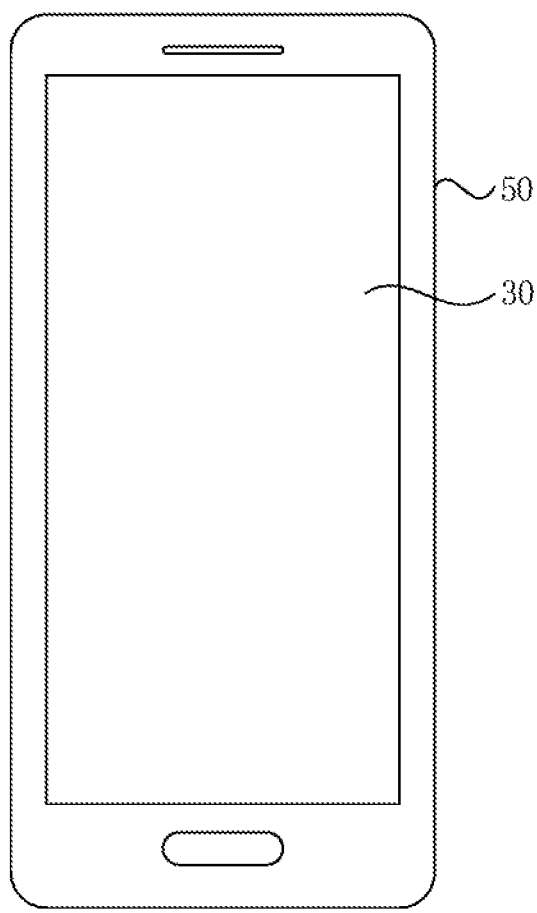
FIG. 31 is a display device according to an embodiment of the present disclosure.

It should be noted that, FIG. 31 merely exemplarily shows that the display device 50 may be a mobile phone. In other embodiments, the display device 50 may also be a computer, a smart wearable device (e.g., smart watch), an on-board display panel, an on-board touch panel or display devices of other types known to the skilled person in the art, which is not limited in the present disclosure.

It should be noted that the above are only some embodiments of the present disclosure and the technical principles used therein. It will be understood by those skilled in the art that the present disclosure is not limited to the embodiments described herein. Those skilled in the art can make various apparent modifications, adaptations, combinations and substitutions without departing from the scope of the present disclosure. Therefore, while the present disclosure has been described in detail via the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A shift register, comprising:
a shift register signal input end, a first clock signal end, a second clock signal end, a third clock signal end, a first power source signal input end, a second power source signal input end, a first signal input end, a second signal input end, a first node, a second node, a third node, a fourth node, a first node control module, a second node control module, a third node control module, a fourth node control node, a first output module, a second output module, a storage module and a coupling module;

wherein the first node control module comprises a first alpha control end, a second alpha control end, a third alpha control end, a first alpha input end, a second alpha input end and an alpha output end;

wherein the first alpha control end is electrically connected to the first clock signal end, wherein the second alpha control end is electrically connected to the second clock signal end, wherein the third alpha control end is electrically connected to the first node, wherein the first alpha input end is electrically connected to the shift register signal input end, wherein the second alpha input end is electrically connected to the first power source signal input end, wherein the alpha output end is electrically connected to the second node;

wherein the first node control module is configured to control a connection between the first alpha input end and the alpha output end according to a signal inputted from the first alpha control end, or control a connection between the second alpha input end and the alpha output end according to a signal inputted from the second alpha control end and a signal inputted from the third alpha control end;

wherein the second node control module comprises a first beta control end, a second beta control end, a first beta input end, a second beta input end and a beta output end;

wherein the first beta control end is electrically connected to the first clock signal end, the second beta control end is electrically connected to the second node, wherein the first beta input end is electrically connected to the second power source signal input end, wherein the second beta input end is electrically connected to the shift register signal input end, the beta output end is electrically connected to the first node; wherein the second node control module is configured to control a connection between the first beta input end and the beta output end according to a signal inputted from the first beta control end, or control a connection between the second beta input end and the beta output end according to a signal inputted by the second beta control end;

wherein the first output module comprises a first gamma control end, a second gamma control end, a first gamma input end, a second gamma input end, a gamma coupling end and a gamma output end, wherein the first gamma control end is electrically connected to the first node, the second gamma control end and the gamma coupling end are electrically connected to the second node, the first gamma input end is electrically connected to the first power source signal input end, the second gamma input end is electrically connected to the second clock signal end, wherein the gamma output end is electrically connected to the first signal output end;

wherein the first output module is configured to control a connection between the first gamma input end and the gamma output end according to a signal inputted from the first gamma control end, or control a connection between the second gamma input end and the gamma output end according to a signal inputted from the second gamma control end;

wherein the third node control module comprises a first delta control end, a second delta control end, a first delta input end, a second delta input end and a delta output end; wherein the first delta control end is electrically connected to the first signal output end, wherein the second delta control end is electrically connected to the third clock signal input end, wherein the first delta input end is electrically connected to the first power source signal input end, the second delta input end is electrically connected to the second power source signal input end, wherein the delta output end is electrically connected to the third node;

wherein the third node control module is configured to control a connection between the first delta input end and the delta output end according to a signal inputted from the first delta control end, or control a connection between the second delta input end and the delta output end according to a signal inputted from the second delta control end;

wherein the fourth node control module comprises a first epsilon control end, a second epsilon control end, a first epsilon input end, a second epsilon input end and an epsilon output end, the first epsilon control end is electrically connected to the third node, wherein the second epsilon control end is electrically connected to the first signal output end, wherein the first epsilon input end is electrically connected to the first power source signal input end, wherein the second epsilon input end is electrically connected to the second power source signal input end, the epsilon output end is electrically connected to the fourth node; wherein the fourth node control module is configured to control a connection between the first epsilon input end and the epsilon output end according to a signal inputted from first epsilon control end, or control a connection between the second epsilon input end and the epsilon output end according to a signal inputted from the second epsilon control end;

wherein the second output module comprises a first zeta control end, a second zeta control end, a first zeta input end, a second zeta input end and a zeta output end, the first zeta control end is electrically connected to the fourth node, the second zeta control end is electrically connected to the third node, the first zeta input end is electrically connected to the first power source signal input end, the second zeta input end is electrically connected to the second power source signal input end, the zeta output end is electrically connected to the second signal output end; wherein the second output module is configured to control a connection between the first zeta input end and the zeta output end according to a signal inputted from the first zeta control end, or control a connection between the second zeta input end and the zeta output end according to a signal inputted from the second zeta control end;

wherein the storage module comprises a first eta end and a second eta end, the first eta end is electrically connected to the first node, the second eta end is electrically connected to the first power source signal input end; the storage module is configured to hold a stable potential at the first node; and wherein the coupling module comprises a first theta end a second theta end, the first theta end is electrically connected to the third node, the second theta end is electrically connected to the second signal input end; the coupling module is configured to, in a case where a potential at the second signal input end varies, couple the potential at the second signal input end to the third node.

2. The shift register according to claim 1, wherein the first node control module comprises a first transistor, a second transistor, a third transistor and a fourth transistor;

wherein a gate electrode of the first transistor and a gate electrode of the second transistor are used as the first alpha control end;

wherein a first electrode of the first transistor is used as the first alpha input end, a second electrode of the first transistor is electrically connected to a first electrode of the second transistor, a second electrode of the second transistor and a first electrode of the third transistor are connected to the alpha output end;

wherein a gate electrode of the third transistor is used as the second alpha control end, a second electrode of the third transistor is electrically connected to a first electrode of the fourth transistor; and wherein a gate electrode of the fourth transistor is used as the third alpha control end, the second electrode of the third transistor is used as the second alpha input end.

3. The shift register according to claim 2, wherein the first node control module further comprises a fifth transistor, wherein the first electrode of the third transistor is electrically connected to a first electrode of the fifth transistor; and wherein a second electrode of the fifth transistor is used as the alpha output end, a gate electrode of the fifth transistor is electrically connected to the second power source signal input end.

4. The shift register according to claim 1, wherein the first node control module comprises a first double-gate transistor, a third transistor and a fourth transistor;

wherein a gate electrode of the first double gate transistor is used as the first alpha control end; and wherein a first electrode of the first double-gate transistor is used as the first alpha input end, a second electrode of the first double-gate transistor and a first electrode of the third transistor are connected to the alpha output end, a gate electrode of the third transistor is used as the second alpha control end, a second electrode of the third transistor is electrically connected to a first electrode of the fourth transistor, a gate electrode of the fourth transistor is used as the third alpha control end, the second electrode of the third transistor is used as the second alpha input end.

5. The shift register according to claim 4, wherein the first node control module further comprises a fifth transistor, wherein the first electrode of the third transistor is electrically connected to a first electrode of the fifth transistor, a second electrode of the fifth transistor is used as the alpha output end, and wherein a gate electrode of the fifth transistor is electrically connected to the second power source signal input end.

6. The shift register according to claim 1, wherein the second node control module comprises a sixth transistor and a seventh transistor;

wherein a gate electrode of the sixth transistor is used as the first beta control end, a first electrode of the sixth transistor is used as the first beta input end, a gate electrode of the seventh transistor is used as the second beta control end, a first electrode of the seventh transistor is used as the second beta input end, and wherein a second electrode of the sixth transistor and a second electrode of the seventh transistor are used as the beta output end.

7. The shift register according to claim 1, wherein the first output end comprises an eighth transistor and a ninth transistor;

wherein a gate electrode of the eighth transistor is used as the second gamma control end, a first electrode of the eighth transistor is used as the second gamma input end, a gate electrode of the ninth transistor is used as the first gamma control end, a first electrode of the ninth transistor is used as the first gamma input end, and wherein a second electrode of the eighth transistor and a second electrode of the ninth transistor are used as the gamma output end.

8. The shift register according to claim 7, wherein the first output module further comprises a first capacitor;

wherein a first end of the first capacitor is electrically connected to the gate electrode of the eighth transistor, and wherein a second end of the first capacitor is also used as the gamma output end.

9. The shift register according to claim 1, wherein the third node control module comprises a tenth transistor, an eleventh transistor and a twelfth transistor;

wherein a gate electrode of the tenth transistor and a gate electrode of the eleventh transistor are used as the delta control end, a first electrode of the tenth transistor is used as the first delta input end, a second electrode of the tenth transistor is electrically connected to a first electrode of the eleventh transistor, a gate electrode of the twelfth transistor is used as the second delta control end, a first electrode of the twelfth transistor is used as the second delta input end, a second electrode of the eleventh transistor and a second electrode of the twelfth transistor are electrically connected to the delta output end; or, wherein the third node control module comprises a second double-gate transistor and a twelfth transistor;

wherein a gate electrode of the second double-gate transistor is used as the first delta control end, a first electrode of the second double-gate transistor is used as the first delta input end, a gate electrode of the twelfth transistor is used as the second delta control end, a first electrode of the twelfth transistor is used as the second delta input end, a second electrode of the second double-gate transistor, and wherein a second electrode of the twelfth transistor are electrically connected to the delta output end.

10. The shift register according to claim 9, wherein the third node control module comprises a thirteenth transistor;

wherein a first electrode of the thirteenth transistor is electrically connected to a second electrode of the twelfth transistor, a second electrode of the thirteenth transistor is used as the delta output end, and wherein a gate electrode of the thirteenth transistor is electrically connected to the second power source signal input end.

11. The shift register according to claim 1, wherein the fourth node control module comprises a fourteenth transistor and a fifteenth transistor;

wherein a gate electrode of the fourteenth transistor is used as the second epsilon control end, a first electrode of the fourteenth transistor is used as the second epsilon input end, a gate electrode of the fifteenth transistor is used as the first epsilon control end, a first electrode of the fifteenth transistor is used as the first epsilon input end, and wherein a second electrode of the fourteenth transistor and a second electrode of the fifteenth transistor are used as the epsilon output end.

12. The shift register according to claim 1, wherein the second output module comprises a sixteenth transistor and a seventeenth transistor;

wherein a gate electrode of the sixteenth transistor is used as the first zeta control end, a first electrode of the sixteenth transistor is used as the first zeta input end, a gate electrode of the seventeenth transistor is used as the second zeta control end, a first electrode of the seventeenth transistor is used as the second zeta input end, a second electrode of the sixteenth transistor and wherein a second electrode of the seventeenth transistor are used as the zeta input end.

13. The shift register according to claim 1, wherein the storage module comprises a second capacitor; and wherein a first end of the second capacitor is used as the first eta end, a second end of the second capacitor is used as the second eta end.

14. The shift register according to claim 1, wherein the coupling module comprises a third capacitor;

wherein a first end of the third capacitor is used as the first theta end, and a second end of the third capacitor is used as the second theta end.

15. A gate driving circuit, comprising a plurality of shift registers;

wherein each of the plurality of shift registers comprises a shift register signal input end, a first clock signal end, a second clock signal end, a third clock signal end, a first power source signal input end, a second power source signal input end, a first signal input end, a second signal input end, a first node, a second node, a third node, a fourth node, a first node control module, a second node control module, a third node control module, a fourth node control node, a first output module, a second output module, a storage module and a coupling module;

wherein the first node control module comprises a first alpha control end, a second alpha control end, a third alpha control end, a first alpha input end, a second alpha input end and an alpha output end, the first alpha control end is electrically connected to the first clock signal end, the second alpha control end is electrically connected to the second clock signal end, the third alpha control end is electrically connected to the first node, the first alpha input end is electrically connected to the shift register signal input end, the second alpha input end is electrically connected to the first power source signal input end, the alpha output end is electrically connected to the second node; the first node control module is configured to control a connection between the first alpha input end and the alpha output end according to a signal inputted from the first alpha control end, or control a connection between the second alpha input end and the alpha output end according to a signal inputted from the second alpha control end and a signal inputted from the third alpha control end;

wherein the second node control module comprises a first beta control end, a second beta control end, a first beta input end, a second beta input end and a beta output end, the first beta control end is electrically connected to the first clock signal end, the second beta control end is electrically connected to the second node, the first beta input end is electrically connected to the second power source signal input end, the second beta input end is electrically connected to the shift register signal input end, the beta output end is electrically connected to the first node; the second node control module is configured to control a connection between the first beta input end and the beta output end according to a signal inputted from the first beta control end, or control a connection between the second beta input end and the beta output end according to a signal inputted by the second beta control end;

wherein the first output module comprises a first gamma control end, a second gamma control end, a first gamma input end, a second gamma input end, a gamma coupling end and a gamma output end, the first gamma control end is electrically connected to the first node, the second gamma control end and the gamma coupling end are electrically connected to the second node, the first gamma input end is electrically connected to the first power source signal input end, the second gamma input end is electrically connected to the second clock signal end, the gamma output end is electrically connected to the first signal output end; the first output module is configured to control a connection between the first gamma input end and the gamma output end according to a signal inputted from the first gamma control end, or control a connection between the second gamma input end and the gamma output end according to a signal inputted from the second gamma control end;

wherein the third node control module comprises a first delta control end, a second delta control end, a first delta input end, a second delta input end and a delta output end, the first delta control end is electrically connected to the first signal output end, the second delta control end is electrically connected to the third clock signal input end, the first delta input end is electrically connected to the first power source signal input end, the second delta input end is electrically connected to the second power source signal input end, the delta output end is electrically connected to the third node; the third node control module is configured to control a connection between the first delta input end and the delta output end according to a signal inputted from the first delta control end, or control a connection between the second delta input end and the delta output end according to a signal inputted from the second delta control end;

wherein the fourth node control module comprises a first epsilon control end, a second epsilon control end, a first epsilon input end, a second epsilon input end and an epsilon output end, the first epsilon control end is electrically connected to the third node, the second epsilon control end is electrically connected to the first signal output end, the first epsilon input end is electrically connected to the first power source signal input end, the second epsilon input end is electrically connected to the second power source signal input end, the epsilon output end is electrically connected to the fourth node; the fourth node control module is configured to control a connection between the first epsilon input end and the epsilon output end according to a signal inputted from first epsilon control end, or control a connection between the second epsilon input end and the epsilon output end according to a signal inputted from the second epsilon control end;

wherein the second output module comprises a first zeta control end, a second zeta control end, a first zeta input end, a second zeta input end and a zeta output end, the first zeta control end is electrically connected to the fourth node, the second zeta control end is electrically connected to the third node, the first zeta input end is electrically connected to the first power source signal input end, the second zeta input end is electrically connected to the second power source signal input end, the zeta output end is electrically connected to the second signal output end; the second output module is configured to control a connection between the first zeta input end and the zeta output end according to a signal inputted from the first zeta control end, or control a connection between the second zeta input end and the zeta output end according to a signal inputted from the second zeta control end;

wherein the storage module comprises a first eta end and a second eta end, the first eta end is electrically connected to the first node, the second eta end is electrically connected to the first power source signal input end; the storage module is configured to hold a stable potential at the first node;

wherein the coupling module comprises a first theta end a second theta end, the first theta end is electrically connected to the third node, the second theta end is electrically connected to the second signal input end; the coupling module is configured to, in a case where a potential at the second signal input end varies, couple the potential at the second signal input end to the third node, wherein the shift register signal input end of a shift register in a first stage among the plurality of shift registers is electrically connected to an initial signal input end of the gate driving circuit, the first signal output end of a shift register in an i-th stage is electrically connected to the shift register signal input end of a shift register in an (i+1)-th stage; wherein i is an positive integer.

16. The gate driving circuit according to claim 15, further comprising a first clock signal line, a second clock signal line and a third clock signal line;

wherein the first clock signal end of each shift register in an odd-numbered stage and the second clock signal of each shift register in an even-numbered stage are electrically connected to the first clock signal line, the second clock signal end of the each shift register in the odd-numbered stage and the first clock signal of the each shift register in the even-numbered stage are electrically connected to the second clock signal line, the third clock signal end of each of the plurality of shift registers in all stages is electrically connected to the third clock signal line;

wherein the first clock signal line is used to provide a first clock signal, the second clock signal line is used to provide a second clock signal, the third clock signal line is used to provide a third clock signal; and wherein a period of the first clock signal and a period of the second clock signal are equal and are double of a period the third clock signal.

17. The gate driving circuit according to claim 15, further comprising a first clock signal line, a second clock signal line, a third clock signal line and a fourth clock signal line;

wherein the first clock signal end of each shift register in an odd-numbered stage and the second clock signal of each shift register in an even-numbered stage are electrically connected to the first clock signal line, the second clock signal end of the each shift register in the odd-numbered stage and the first clock signal of the each shift register in the even-numbered stage are electrically connected to the second clock signal line, the third clock signal end of the each shift register in the odd-numbered stage is electrically connected to the third clock signal line, the third clock signal end of the each shift register in the even-numbered stage is electrically connected to the fourth clock signal line;

wherein the first clock signal line is used to provide a first clock signal, the second clock signal line is used to provide a second clock signal, the third clock signal line is used to provide a third clock signal, the fourth clock signal line is used to provide a fourth clock signal; and wherein a period of the first clock signal, a period of the second clock signal, a period of the third clock signal and a period of the fourth clock signal are equal.

18. A display panel, comprising a display region and a non-display region surrounding the display region, wherein the non-display region is provided with a gate driving circuit;

wherein the gate driving circuit comprises a plurality of shift registers;

wherein each of the plurality of shift registers comprises a shift register signal input end, a first clock signal end, a second clock signal end, a third clock signal end, a first power source signal input end, a second power source signal input end, a first signal input end, a second signal input end, a first node, a second node, a third node, a fourth node, a first node control module, a second node control module, a third node control module, a fourth node control node, a first output module, a second output module, a storage module and a coupling module;

wherein the first node control module comprises a first alpha control end, a second alpha control end, a third alpha control end, a first alpha input end, a second alpha input end and an alpha output end, the first alpha control end is electrically connected to the first clock signal end, the second alpha control end is electrically connected to the second clock signal end, the third alpha control end is electrically connected to the first node, the first alpha input end is electrically connected to the shift register signal input end, the second alpha input end is electrically connected to the first power source signal input end, the alpha output end is electrically connected to the second node; the first node control module is configured to control a connection between the first alpha input end and the alpha output end according to a signal inputted from the first alpha control end, or control a connection between the second alpha input end and the alpha output end according to a signal inputted from the second alpha control end and a signal inputted from the third alpha control end;

wherein the second node control module comprises a first beta control end, a second beta control end, a first beta input end, a second beta input end and a beta output end, the first beta control end is electrically connected to the first clock signal end, the second beta control end is electrically connected to the second node, the first beta input end is electrically connected to the second power source signal input end, the second beta input end is electrically connected to the shift register signal input end, the beta output end is electrically connected to the first node; the second node control module is configured to control a connection between the first beta input end and the beta output end according to a signal inputted from the first beta control end, or control a connection between the second beta input end and the beta output end according to a signal inputted by the second beta control end;

wherein the first output module comprises a first gamma control end, a second gamma control end, a first gamma input end, a second gamma input end, a gamma coupling end and a gamma output end, the first gamma control end is electrically connected to the first node, the second gamma control end and the gamma coupling end are electrically connected to the second node, the first gamma input end is electrically connected to the first power source signal input end, the second gamma input end is electrically connected to the second clock signal end, the gamma output end is electrically connected to the first signal output end; the first output module is configured to control a connection between the first gamma input end and the gamma output end according to a signal inputted from the first gamma control end, or control a connection between the second gamma input end and the gamma output end according to a signal inputted from the second gamma control end;

wherein the third node control module comprises a first delta control end, a second delta control end, a first delta input end, a second delta input end and a delta output end, the first delta control end is electrically connected to the first signal output end, the second delta control end is electrically connected to the third clock signal input end, the first delta input end is electrically connected to the first power source signal input end, the second delta input end is electrically connected to the second power source signal input end, the delta output end is electrically connected to the third node; the third node control module is configured to control a connection between the first delta input end and the delta output end according to a signal inputted from the first delta control end, or control a connection between the second delta input end and the delta output end according to a signal inputted from the second delta control end;

the fourth node control module comprises a first epsilon control end, a second epsilon control end, a first epsilon input end, a second epsilon input end and an epsilon output end, the first epsilon control end is electrically connected to the third node, the second epsilon control end is electrically connected to the first signal output end, the first epsilon input end is electrically connected to the first power source signal input end, the second epsilon input end is electrically connected to the second power source signal input end, the epsilon output end is electrically connected to the fourth node; the fourth node control module is configured to control a connection between the first epsilon input end and the epsilon output end according to a signal inputted from first epsilon control end, or control a connection between the second epsilon input end and the epsilon output end according to a signal inputted from the second epsilon control end;

wherein the second output module comprises a first zeta control end, a second zeta control end, a first zeta input end, a second zeta input end and a zeta output end, the first zeta control end is electrically connected to the fourth node, the second zeta control end is electrically connected to the third node, the first zeta input end is electrically connected to the first power source signal input end, the second zeta input end is electrically connected to the second power source signal input end, the zeta output end is electrically connected to the second signal output end; the second output module is configured to control a connection between the first zeta input end and the zeta output end according to a signal inputted from the first zeta control end, or control a connection between the second zeta input end and the zeta output end according to a signal inputted from the second zeta control end;

wherein the storage module comprises a first eta end and a second eta end, the first eta end is electrically connected to the first node, the second eta end is electrically connected to the first power source signal input end; the storage module is configured to hold a stable potential at the first node;

wherein the coupling module comprises a first theta end a second theta end, the first theta end is electrically connected to the third node, the second theta end is electrically connected to the second signal input end; the coupling module is configured to, in a case where a potential at the second signal input end varies, couple the potential at the second signal input end to the third node, wherein the shift register signal input end of a shift register in a first stage among the plurality of shift registers is electrically connected to an initial signal input end of the gate driving circuit, the first signal output end of a shift register in an i-th stage is electrically connected to the shift register signal input end of a shift register in an (i+1)-th stage; wherein i is an positive integer, and wherein the display regions is provided with a plurality of scanning lines and a plurality of data lines, the plurality of scanning lines and the plurality of data lines intersect each other and define a plurality of sub-pixel regions, each sub-pixel regions is provides with one pixel circuit; the pixel circuit comprises at least one N-type transistor and at least one P-type transistor; in each row of pixel circuits, control ends of N-type transistors are electrically connected to the second signal output end of a shift register in one stage via one of the plurality of scanning line, control ends of P-type transistors are electrically connected to the first signal output end of the shift register in said stage via another one of the plurality of scanning lines.

19. The display panel according to claim 18, wherein the display panel comprises two said gate driving circuits arranged in the non-display region on opposite sides of the display region;

wherein one of the gate driving circuits is connected to scanning lines corresponding to pixel circuits in odd-numbered stages of the display panel, the other one of the gate driving circuits is connected to scanning lines corresponding to pixel circuits in even-numbered stages of the display panel; or wherein shift registers in one of the gate driving circuits and shift registers in the other one of the gate driving circuits are arranged in one-to-one correspondence, two ends of each scanning line in the display panel are connected to corresponding shift registers of the gate driving circuits respectively; or, wherein the display panel comprises one gate driving circuit; and wherein each shift register in the gate driving circuit is connected to one of the plurality of scanning lines corresponding to one row of pixel circuits in the display panel.

20. A display device, comprising a display panel according to claim 18.

* * * * *